(12) United States Patent
Kawabata et al.

(10) Patent No.: US 7,656,154 B2
(45) Date of Patent: Feb. 2, 2010

(54) MAGNETIC FIELD MEASUREMENT SYSTEM AND OPTICAL PUMPING MAGNETOMETER

(75) Inventors: Ryuuzou Kawabata, Kokubunji (JP); Akihiko Kandori, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 610 days.

(21) Appl. No.: 11/604,767

(22) Filed: Nov. 28, 2006

(65) Prior Publication Data
US 2007/0120563 A1 May 31, 2007

(30) Foreign Application Priority Data
Nov. 28, 2005 (JP) ............................. 2005-342698
May 18, 2006 (JP) ............................. 2006-138389

(51) Int. Cl.
G01R 33/035 (2006.01)
G01V 3/00 (2006.01)
G01R 33/02 (2006.01)

(52) U.S. Cl. .................. 324/244.1; 324/248; 324/304; 600/409; 505/162; 505/846

(58) Field of Classification Search ............. 324/96–97, 324/244.1, 248, 304–305, 313, 319; 505/162, 505/845–846; 600/409; 326/5; 327/527; 359/484
See application file for complete search history.

(56) References Cited

U.S. PATENT DOCUMENTS 3,667,066 A * 5/1972 Kastler et al. ................. 331/3

6,472,869 B1 * 10/2002 Upschulte et al. ........... 324/304
7,038,450 B2 * 5/2006 Romalis et al. ............. 324/304

FOREIGN PATENT DOCUMENTS

JP 11-309122 11/1999
JP 2000-037362 2/2000

OTHER PUBLICATIONS

G.Bison, et al., a Laser-Punped Magnetometer for the Mapping of Human Cardiomagnetic Fields:, Appl. Phys. B 76, 325-328 (2003).
P. Schwindt, et al., "Chip-Scale Atomic Magnetometer", Applied Physics Letters, vol. 85, No. 26, p. 6409 (2004).

* cited by examiner

*Primary Examiner*—Bot L LeDynh
(74) *Attorney, Agent, or Firm*—Antonelli, Terry, Stout & Kraus, LLP.

(57) ABSTRACT

Provided is a highly accurate optical pumping magnetometer, in which a static magnetic field and an oscillating field to be applied to a vapor cell are stabilized. To this end, the optical pumping magnetometer includes: Helmholtz coils for applying a constant static magnetic field to a vapor cell serving as a magnetic field detector; fluxgate magnetometers for detecting environmental magnetic noise in two directions of X-axis direction and Y-axis direction other than Z-axis direction which is a direction for detecting a magnetic field coming out of a measurement object while locating the vapor cell in the center thereof; magnetometer drive circuits for driving the fluxgate magneotometers; current converters for converting outputs of the magnetometer drive circuits into amount of currents; and magnetic field generating coils for generating a magnetic field in a phase opposite to the environmental magnetic noise in the two directions.

50 Claims, 33 Drawing Sheets

MAGNETIC FIELD MEASUREMENT SYSTEM AND OPTICAL PUMPING MAGNETOMETER

CLAIM OF PRIORITY

The present application claims priority from Japanese applications JP 2005-342698 filed on Nov. 28, 2005 and JP 2006-138389 filed on May 18, 2006, the contents of which are hereby incorporated by reference into this application.

BACKGROUND OF THE INVENTION

1. Field of the Invention

The present invention relates to a magnetic field measurement system and an optical pumping magnetometer, and more specifically to a magnetic field measurement system for measuring biomagnetism.

2. Description of the Related Art

When performing accurate biomagnetic measurement, it is essential to grasp the degree of environmental magnetic noise (such as geomagnetism or time-varying magnetism generated when an automobile or an electric train passes nearby) that hinder biomagnetic signal measurement. Conventional combinations of a magnetic sensor for biomagnetic measurement and a reference sensor for environmental magnetic measurement, which are used for highly accurate biomagnetic measurement, include a combination of a superconducting quantum interference device (SQUID) magnetometer and a fluxgate magnetometer, a combination of a SQUID magnetometer and another SQUID magnetometer, and a combination of an optical pumping magnetometer and another optical pumping magnetometer.

In the case of using the SQUID magnetometer as the magnetic sensor for the biomagnetic measurement while using the fluxgate magnetometer as the reference sensor for the environmental magnetic measurement, the SQUID magnetometer is housed in a Dewar containing liquid helium (or liquid nitrogen) located inside a magnetic shield room for shielding the environmental magnetic noise. The fluxgate magnetometer is disposed outside the magnetic shield room to measure the environmental magnetic noise of the outside. A voltage signal obtained by the fluxgate magnetometer is converted into an amount of current by a current converter, and the current is caused to flow through a magnetic field generating coil disposed on an outside wall of the magnetic shield room to reduce the environmental magnetic noise that enters the magnetic shield room (Japanese Patent Laid-Open Official Gazette No. 2000-37362).

In the case of using the SQUID magnetometers both as the magnetic sensor for the biomagnetic measurement and as the reference sensor for the environmental magnetic measurement, the respective SQUID magnetometers are housed in the Dewar containing liquid helium (or liquid nitrogen) located inside the magnetic shield room. The SQUID magnetometer for the biomagnetic measurement is located immediately above a measurement object, and the SQUID magnetometer as the reference sensor is located above the SQUID magnetometer for the biomagnetic measurement. A difference between signals obtained from the respective SQUID magnetometers is calculated by use of a subtraction circuit to detect only a biomagnetic signal coming out of the measurement object (Japanese Patent Laid-Open Official Gazette No. Hei-11(1999)-309122).

In the case of using the optical pumping magnetometers both as the magnetic sensor for the biomagnetic measurement and as the reference sensor for the environmental magnetic measurement, a vapor cell for the biomagnetic measurement is located immediately above a measurement object, and a vapor cell as the reference sensor is located above the vapor cell for the biomagnetic measurement. A difference between output signals from lock-in amplifiers, the signals obtained by the respective optical pumping magnetometers, is calculated by use of a subtraction circuit to detect only a biomagnetic signal coming out of the measurement object (Appl. Phys. B76, pp. 325-328 (2003)).

In addition, a method is also reported in which a vertical cavity surface emitting semiconductor laser is used as a chip-scale small optical pumping magnetometer (Appl. Phys. Lett. 85, 6409 (2004)). A coherent population trapping (CPT) resonance is applied to the method of using the vertical cavity surface emitting semiconductor laser. The report says that the sensitivity is 50 pT/√Hz, and that it is necessary to improve the sensitivity at least 100 times or more in order to measure biosignals.

SUMMARY OF THE INVENTION

In the case of the system combining the SQUID magnetometer and the fluxgate magnetometer, the fluxgate magnetometer is available at a low price but has low detection sensitivity. Accordingly, the system can detect large environmental magnetic noise but has difficulty in detecting weak environment magnetic signals such as the biomagnetism. Moreover, in the light of the detection sensitivity, there are problems that this system cannot be used inside the magnetic shield room that shields the environmental magnetic noise, and so on.

The system combining the two SQUID magnetometers can realize highly accurate magnetic measurement because these SQUID magnetometers have extremely high sensitivity. Nevertheless, in order to obtain the difference from the SQUID magnetometer for the biomagnetic measurement, the SQUID magnetometer as the reference sensor is disposed above the SQUID magnetometer for the biomagnetic measurement. As a result, there arises a problem that the Dewar is virtually increased in size thereby the magnetic shield room for disposing the measurement system is also increased in size. Moreover, since the SQUID magnetometer as the reference sensor is located above the Dewar, the coolant is quick to evaporate in this case. As a result, the frequency of refilling liquid helium (or liquid nitrogen) is increased. This poses problems in terms of operations and costs for its maintenance.

The optical pumping magnetometer is operated solely by use of electricity and does not require a coolant such as liquid helium which is essential in the SQUID magnetometer. This makes the running costs and maintenance costs unnecessary. However, if environmental magnetic noise enters a vapor cell of a magnetic detector, the noise changes intensities and frequencies of a static magnetic field $B_0$ and of an oscillating magnetic field $B_{RF}$ which are applied to the vapor cell. For this reason, it is necessary to provide a magnetic shield room in order to detect faint biomagnetic signals with the optical pumping magnetometer. Moreover, the oscillating magnetic field $B_{RF}$ which is indispensable for operating the optical pumping magnetometer has a risk of affecting operation of a cardiac pacemaker. Accordingly, there is a problem when performing measurement of a cardiac magnetic field on a pacemaker-implanted patient undergoing a therapy for cardiac conduction disturbance or arrhythmia.

Given this factor, it is also conceivable that the optical pumping magnetometer is used as the reference sensor for measuring the environmental magnetic noise while the SQUID magnetometer is used for measuring the biomagnetism. However, the operation of the optical pumping magnetometer causes the following problems. Oscillating magnetic field components attributed to an RF coil used in the optical pumping magnetometer are included in biomagnetic signals to be measured with the SQUID magnetometer, and this hinders accurate biomagnetic measurement. Moreover, the oscillating magnetic field component affects, as stray noise, voltage-current characteristics at a superconducting tunnel junction of the SQUID magnetometer, and the SQUID magnetometer fails to operate normally. In addition, when operating the SQUID magnetometer and the optical pumping magnetometer without using the magnetic shield room, large environmental magnetic noise enters the vapor cell which serves as the magnetic detector of the optical pumping magnetometer. This causes instability of the static magnetic field $B_0$ and the oscillating magnetic field $B_{RF}$ to be applied to the vapor cell, and hinders accurate measurement of the environmental magnetic noise. In the case of measuring the cardiac magnetic field, there is a risk that the oscillating magnetic field $B_{RF}$ affects the pacemaker, the risk being attributed to operation of the optical pumping magnetometer.

In view of the foregoing problems, in a magnetic field measurement system using an optical pumping magnetometer as a reference sensor, it is an object of the present invention to stabilize a static magnetic field $B_0$ and an oscillating magnetic field $B_{RF}$ to be applied to a vapor cell by reducing environmental magnetic noise that enters the optical pumping magnetometer without using a magnetic shield room, to prevent the oscillating magnetic field $B_{RF}$ from constituting an error signal in a biomagnetic signal and from affecting operation of a SQUID magnetometer, and to avoid an adverse effect of the oscillating magnetic field $B_{RF}$ to a pacemaker.

Moreover, when operating a multichannel optical pumping magnetometer configured by combining a plurality of optical pumping magnetometers, in terms of oscillating magnetic fields which are respectively applied to individual vapor cells, the oscillating magnetic fields of neighboring vapor cells interfere with one another. For this reason, there is a problem that it is not possible to apply accurate oscillating magnetic fields to the respective vapor cells, and thereby it is difficult to detect magnetic fields.

In the present invention, in three axial directions centered on a vapor cell of an optical pumping magnetometer used as a reference sensor, magnetometers such as fluxgate magnetometers for detecting environmental magnetic noise are disposed in two directions (X-axis direction and Y-axis direction) among the three directions except a direction of application of a static magnetic field (Z-axis direction), and the detected environmental magnetic noise is applied, through a current converter configured to convert the noise into an amount of current, to magnetic field generating coils disposed in the two directions of the vapor cell so as to cancel the environmental magnetic noise applied to the vapor cell in the directions other than the direction of application of the static magnetic field.

According to an aspect of the present invention, a vapor cell, a Helmholtz coil and a radio-frequency (RF) coil of an optical pumping magnetometer are disposed inside a tube made of a metal having high magnetic permeability such as Permalloy or Mumetal. The environmental magnetic noise is guided from openings of the tube to the vapor cell inside the tube. Laser-beam transmission holes are formed in a side surface of the tube, and a magnetometer such as a fluxgate magnetometer for detecting the environmental magnetic noise is disposed in front of one of the transmission holes. Then, a magnetic field in a phase opposite to the environmental magnetic noise detected with the magnetometer is applied in a direction connecting the laser-beam transmission holes so as to cancel the environmental magnetic noise applied to the vapor cell in the directions other than the direction of application of the static magnetic field.

According to another aspect of the present invention, a vapor cell, a Helmholtz coil and a RF coil are disposed inside a tube made of a metal having high magnetic permeability such as Permalloy or Mumetal. A laser beam is made incident on the vapor cell in an axial direction of the tube. Holes for transmitting environmental magnetic noise are formed in a side surface of the tube. A magnetometer such as a fluxgate magnetometer for detecting foreign magnetic noise is disposed in front of one of openings of the tube on which the laser beam is made incident. Then, a magnetic field in a phase opposite to the environmental magnetic noise detected with the magnetometer is applied in the axial direction of the tube so as to cancel the environmental magnetic noise applied to the vapor cell in the directions other than the direction of application of the static magnetic field.

The optical pumping magnetometer of the present invention is applicable not only to the reference sensor for highly accurate and highly sensitive biomagnetic measurement but also to a magnetic sensor for a wide range of magnetic measurement such as geomagnetism measurement and nondestructive inspection.

In the case of the present invention, in a magnetic field measurement system combining a SQUID magnetometer for biomagnetic measurement and an optical pumping magnetometer for environmental magnetic noise measurement, a magnetic field generating coil is disposed between a measurement object and the SQUID magnetometer. Environmental magnetic noise detected by the optical pumping magnetometer is converted into an amount of current by use of a current converter, and the amount of the current is transmitted to the magnetic field generating coil. Then, the environmental magnetic noise is cancelled by causing the magnetic field generating coil to output a magnetic field in a phase opposite to the environmental magnetic noise that enters the SQUID magnetometer.

In the case of the present invention, in the magnetic field measurement system combining the SQUID magnetometer for biomagnetic measurement and the optical pumping magnetometer for environmental magnetic noise measurement, an output from the SQUID magnetometer and an output from the optical pumping magnetometer are inputted to a subtraction circuit. Accordingly, an accurate biomagnetic signal is obtained by removing the environmental magnetic noise from an output from the subtraction circuit.

In the case of the present invention, a vapor cell, static magnetic field applying coils and RF coils of an optical pumping magnetometer are disposed inside a magnetic shield case made of metal having high magnetic permeability such as Permalloy or Mumetal. The magnetic shield case includes holes respectively provided for allowing entry of beam from a light source and magnetism from a measurement object. By housing the vapor cell, the static magnetic field applying coils and the RF coils inside the magnetic shield case, it is possible to reduce environmental magnetic noise entering the vapor cell and thereby to apply a stable static magnetic field and a stable oscillating magnetic field to the vapor cell.

In the case of the present invention, a vapor cell, two pairs of static magnetic field applying coils, and RF coils are disposed inside a magnetic shield case made of metal having high magnetic permeability such as Permalloy or Mumetal. The two pairs of static magnetic field applying coils are used for obtaining a vectorial sum of static magnetic fields coming out of the two pairs of static magnetic field applying coils. The magnetic shield case includes holes respectively provided for allowing entry of beam from a light source and magnetism from a measurement object. By housing the vapor cell, the static magnetic field applying coils and the RF coils inside the magnetic shield case, it is possible to reduce environmental magnetic noise entering the vapor cell and thereby to apply a stable static magnetic field and a stable oscillating magnetic field to the vapor cell.

In the case of the present invention, a vapor cell, static magnetic field applying coils and RF coils of an optical pumping magnetometer are disposed inside a magnetic shield case made of metal having high magnetic permeability such as Permalloy or Mumetal. The magnetic shield case includes holes respectively provided for allowing entry of beam from a light source and magnetism from a measurement object. A magnetometer such as a fluxgate magnetometer for detecting environmental magnetic noise is disposed adjacently to the hole in an optical axis direction of the light source. A magnetic field generating coil is disposed between the magnetometer and the hold in the optical axis direction of the light source, and a magnetic field in a phase opposite to the environmental magnetic noise detected with the magnetometer is applied to the magnetic field generating coil so as to cancel the environmental magnetic noise entering the magnetic shield case in the optical axis direction of the light source.

In the case of the present invention, a vapor cell, two pairs of static magnetic field applying coils and RF coils of an optical pumping magnetometer are disposed inside a magnetic shield case made of a metal having high magnetic permeability such as Permalloy or Mumetal. The two pairs of static magnetic field applying coils are used for obtaining a vectorial sum of static magnetic fields coming out of the two pairs of static magnetic field applying coils. The magnetic shield case includes holes respectively provided for allowing entry of beam from a light source and magnetism from a measurement object. A magnetometer such as a fluxgate magnetometer for detecting environmental magnetic noise is disposed adjacently to the hole in an optical axis direction of the light source. A magnetic field generating coil is disposed between the magnetometer and the hold in the optical axis direction of the light source, and a magnetic field in a phase opposite to the environmental magnetic noise detected with the magnetometer is applied to the magnetic field generating coil so as to cancel the environmental magnetic noise entering the magnetic shield case in the optical axis direction of the light source.

In the case of the present invention, a vapor cell and static magnetic field applying coils of an optical pumping magnetometer are disposed inside a magnetic shield case made of metal having high magnetic permeability such as Permalloy or mu Mumetal. The magnetic shield case includes a single hole used in common for allowing entry of beam from a light source and magnetism from a measurement object. By housing the vapor cell and the static magnetic field applying coils inside the magnetic shield case, it is possible to reduce environmental magnetic noise entering the vapor cell.

In the case of the present invention, an electro-optic modulator of an optical pumping magnetometer is disposed inside an electromagnetic shield case made of metal having high conductivity such as copper or aluminum. The electromagnetic shield case includes a hole for allowing entry of beam from a light source. By housing the electro-optic modulator inside the electromagnetic shield case, it is possible to reduce high-frequency noise generated by the electro-optic modulator.

According to another aspect of the present invention, when defining the static magnetic field to be applied to the vapor cell of the optical pumping magnetometer by using the two pairs of static magnetic field applying coils and obtaining the vectorial sum of the static magnetic fields coming out of the two pairs of static magnetic field applying coils, magnetometers such as fluxgate magnetometers for detecting environmental magnetic noise are disposed in the two directions of static magnetic field application from the static magnetic field applying coils and in a direction of an oscillating magnetic field from the RF coils. Then, a magnetic field in a phase opposite to the environmental magnetic noise detected with the magnetometer is applied in the two directions of static magnetic field application and in the direction of oscillating magnetic field application so as to cancel the environmental magnetic noise entering the vapor cell in the two directions of static magnetic field application and in the direction of oscillating magnetic field application.

In the case of the present invention, when using a multi-channel optical pumping magnetometer by disposing sets in a lattice, each of the sets being configured of a vapor cell serving as a magnetic detector, static magnetic applying coils and RF coils of an optical pumping magnetometer, interference among oscillating magnetic fields applied to the vapor cells is prevented by applying mutually different static magnetic field intensities to the respective vapor cells. Here, the static magnetic field intensities to be applied to the respective vapor cells are adjusted in order that a magnitude on the longitudinal axis at an intersection of each of optical magnetic resonance curves obtained by applying the oscillating magnetic fields to the individual vapor cells can be smaller than a half value of a peak of an optical magnetic resonance curve connecting the intersections.

According to the present invention, it is possible to achieve higher accuracy and higher sensitivity of an optical pumping magnetometer by suppressing environmental magnetic noise entering a vapor cell which serves as a magnetic detector of the optical pumping magnetometer used as a reference sensor, the noise entering in a direction other than a direction of static magnetic field application. For this reason, it is possible to perform biomagnetic measurement without an expensive magnetic shield room that has been required in a conventional system. Moreover, since the magnetic shield room is not required, it is possible to reduce a measurement site and thereby to achieve a free layout of the reference sensor. It is also possible to suppress an adverse effect on operation of the SQUID magnetometer by adjusting a frequency band of the oscillating magnetic field $B_{RF}$ of the optical pumping magnetometer or by shielding only the peripheral part of the vapor cell, the Helmholtz coils, and the RF coils. In addition, it is possible to suppress an adverse effect on a pacemaker-implanted patient. Moreover, it is possible to downsize the Dewar and to reduce maintenance and running costs as compared to a system using two SQUID magnetometers.

Moreover, according to the present invention, in a multi-channel optical pumping magnetometer configured by combining a plurality of optical pumping magnetometers, it is possible not only to suppress environmental magnetic noise that enters each of vapor cells but also to prevent interference among oscillating magnetic fields applied to the respective vapor cells and to accurately and stably detect magnetism from a measurement object by each channel, by housing only magnetic detectors each configured of vapor cells, static magnetic field applying coils and RF coils in the magnetic shield cases, or by setting mutually different static magnetic field intensities to be applied to the respective vapor cells and adjusting the static magnetic field intensities to be applied to the respective vapor cells in order that a magnitude on the longitudinal axis at an intersection of each of optical magnetic resonance curves obtained by applying the oscillating magnetic fields to the individual vapor cells can be smaller than a half value of a peak of an optical magnetic resonance curve connecting the intersections. Moreover, it is possible to perform cardiac magnetic field measurement on a pacemaker-implanted patient, since leakage of the oscillating magnetic field to the heart can be suppressed by use of a magnetic shield case. Furthermore, when the multichannel optical pumping magnetometer is used as a substitute for a SQUID magnetometer for biomagnetic measurement, the multichannel optical pumping magnetometer does not require a coolant (liquid helium or liquid nitrogen) at all unlike the SQUID magnetometer. For this reason, it is possible to eliminate maintenance and running costs related to the coolant. Moreover, since the Dewar for preserving the coolant is unnecessary, it is possible to downsize the measurement system as compared to the conventional system using the SQUID magnetometer.

DETAILED DESCRIPTION OF THE PREFERRED EMBODIMENTS

Hereinafter, embodiments of the present invention will be described with reference to the accompanying drawings.

Figure 1:
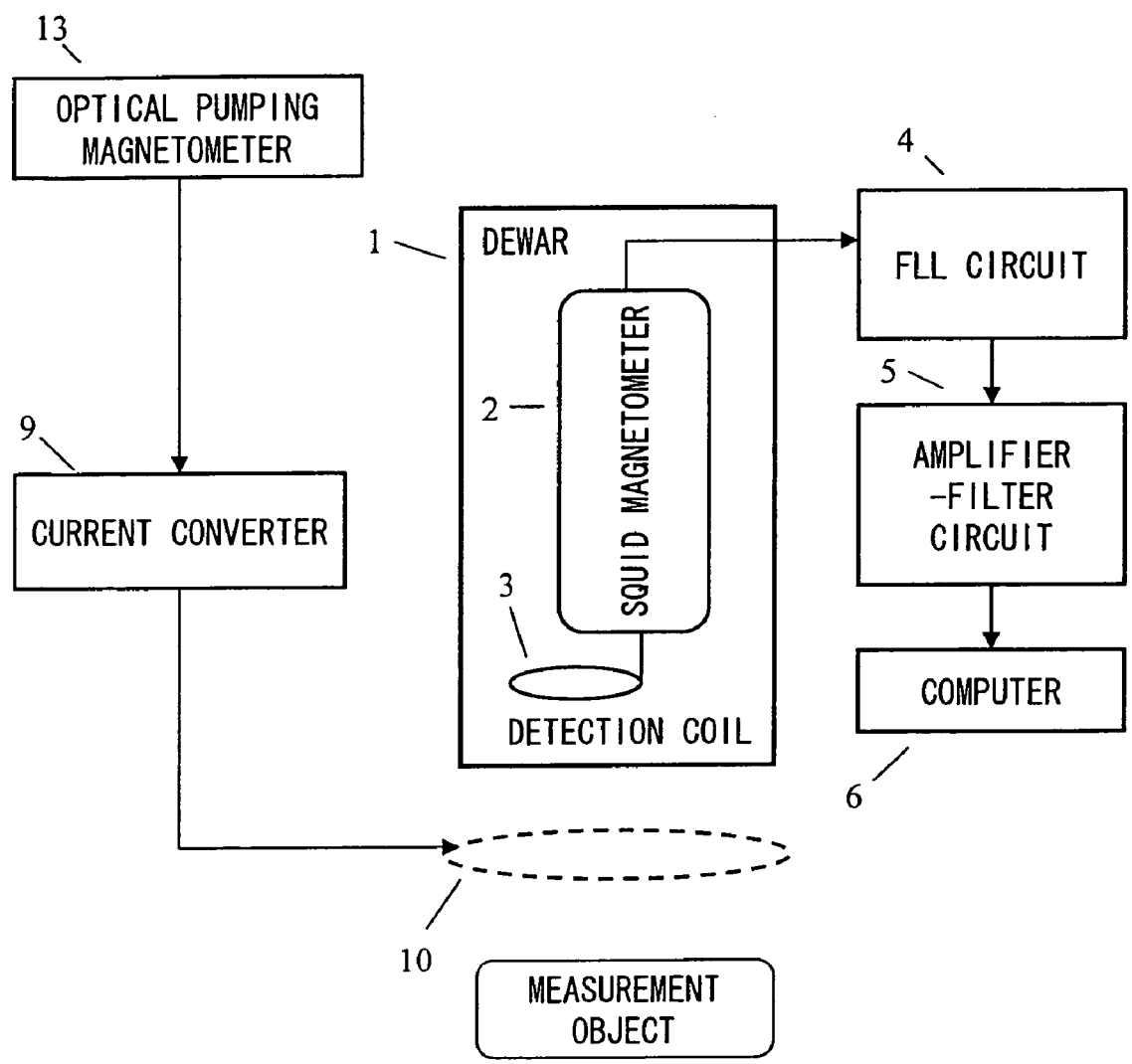
FIG. 1 is a diagram showing a configuration example of a biomagnetic measurement system of the present invention configured by combining a superconducting quantum interference device (SQUID) magnetometer and an optical pumping magnetometer.

FIG. 1 is a diagram showing a configuration example of a biomagnetic measurement system of the present invention, in which a superconducting quantum interference device (SQUID) magnetometer 2 is used for biomagnetic measurement, and in which an optical pumping magnetometer 13 is used for environmental magnetic noise measurement.

A SQUID magnetometer 2 including a detection coil 3 is housed in a Dewar 1 filled with liquid helium (or liquid nitrogen). When measuring a biomagnetic signal from a measurement object with the SQUID magnetometer 2, environmental magnetic noise entering the SQUID magnetometer 2 is detected with an optical pumping magnetometer 13 which is disposed above the SQUID magnetometer 2. A signal detected with the optical pumping magnetometer 13 is converted into an amount of current by a current converter 9, and is transmitted to a magnetic field generating coil 10 disposed between the measurement object and the SQUID magnetometer 2. The environmental magnetic noise is cancelled by generating a magnetic field in a phase opposite to the environmental magnetic noise from the magnetic field generating coil 10, thereby enabling the SQUID magnetometer 2 to detect an accurate biomagnetic signal. An output from the SQUID magnetometer 2 is converted into an electric signal by a flux locked loop circuit (an FLL circuit, which is equivalent to a SQUID magnetometer drive circuit) 4, and is processed into a signal in an optimal frequency band by use of an amplifier-filter circuit 5. Then, the signal is collected by a computer 6.

Here, in addition to the method of canceling the environmental magnetic noise actively by use of the magnetic field generating coil 10, it is also possible to correct the biomagnetic signal by causing the environmental magnetic noise detected with the SQUID magnetometer 2 and an output signal from the FLL circuit 4 to pass through a subtraction circuit 11, or alternatively to correct the biomagnetic signal by means of software performing digital signal processing.

Figure 2:
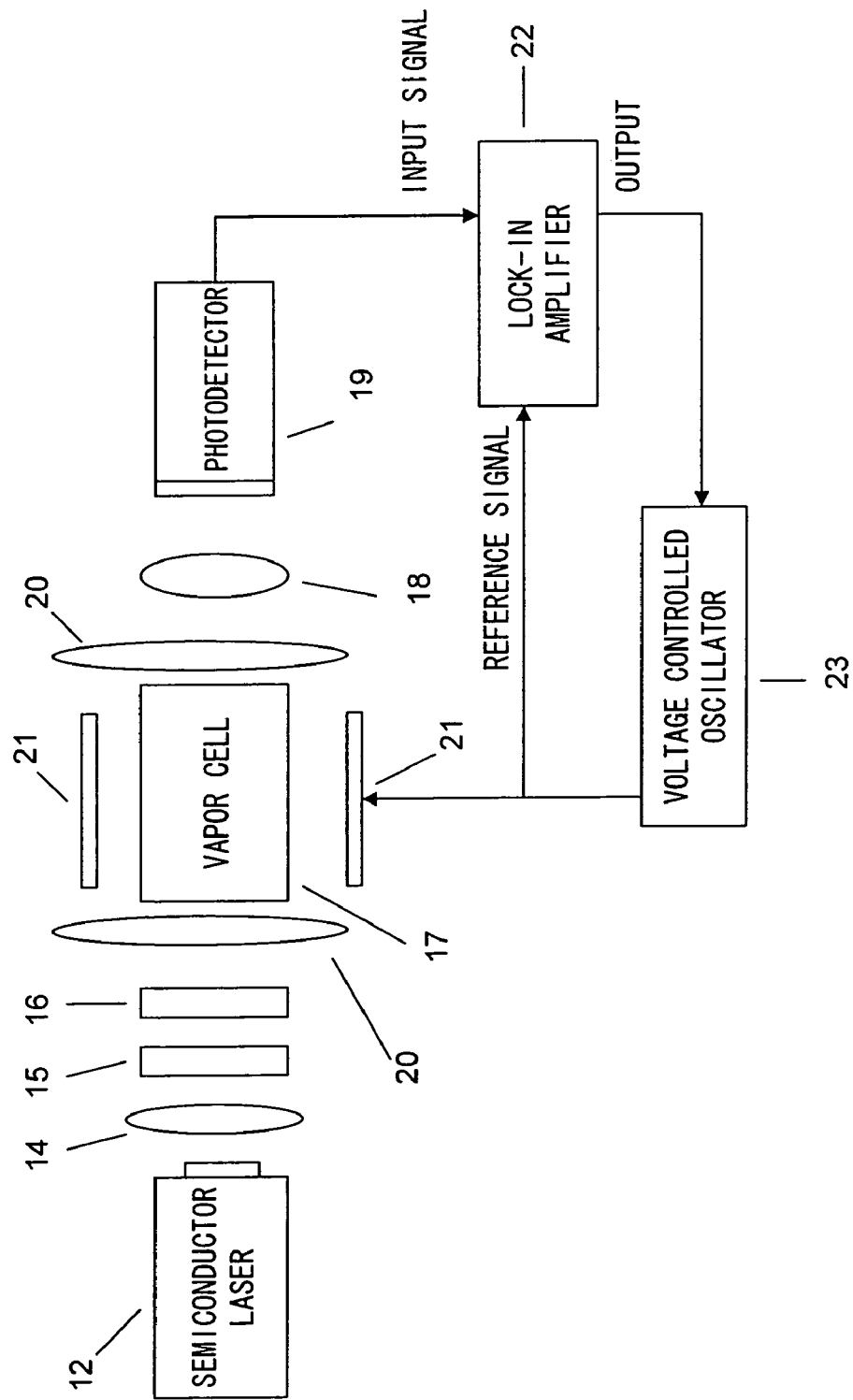
FIG. 2 is a diagram showing a configuration example of the optical pumping magnetometer.

The optical pumping magneteometer used as a reference sensor in the present invention will be described with reference to FIG. 2.

The optical pumping magnetometer includes: an optical system composed of a vapor cell 17 serving as a magnetic field detector, a semiconductor laser 12, a collimating lens 14, a polarizer 15, a wavelength plate 16, a condenser lens 18, and a photodetector 19; a magnetic system composed of Helmholtz coils 20 and radio-frequency (RF) coils 21; and a signal processing system composed of a lock-in amplifier 22 and a voltage controlled oscillator 23. A static magnetic field $B_0$ is applied to the vapor cell 17 filled with an alkali metal such as potassium, rubidium or cesium by use of the Helmholtz coils 20. At this time, an energy level of the alkali metal atoms inside the vapor cell 17 is split into a plurality of levels due to the Zeeman effect. Light is irradiated from the semiconductor laser 12 onto the vapor cell 17 in the state of static magnetic field application. At this time, the beam from the semiconductor laser 12 is converted into parallel beam by the collimating lens 14, and circularly polarized beam generated by way of the polarizer 15 and the wavelength plate 16 is irradiated.

The atoms on the ground level subjected to Zeeman splitting by irradiation of the circularly polarized beam are excited, and then the level of the atoms returns from the excited level to the ground level along with energy deactivation. Once a sufficient time passed from the irradiation of the circularly polarized beam, the energy levels of the atoms inside the vapor cell 17 enter a polarized state occupied by specific ground levels. When the atoms are in the polarized state, the circularly polarized beam is not absorbed any longer. The atoms in the polarized state are precessing proportionately with the intensity of the static magnetic field $B_0$ applied to the vapor cell 17. At this time, an oscillating magnetic field $B_{RF}$ is applied to a plane, which is orthogonal to the direction of static magnetic field application, through the voltage controlled oscillator 23 by use of the RF coils 21 disposed around the vapor cell 17. Here, when a precession frequency of the atoms coincides with a frequency of the oscillating magnetic field $B_{RF}$, the polarized state disappears due to optical magnetic resonance generated by oscillating magnetic field application, thereby the atoms restart to absorb the beam.

The optical pumping magnetometer is configured to utilize variation in transmitted beam through the vapor cell 17, the variation being caused by the optical magnetic resonance attributable to RF modulation. The beam transmitted through the vapor cell 17 is detected by the photodetector 19 through the condenser lens 18, and is converted into an electric signal. The electric signal from the photodetector 19 is inputted to the lock-in amplifier 22 as an input signal while an electric signal from the voltage controlled oscillator 23 is inputted thereto as a reference signal. A magnetic field from the measurement object that enters the vapor cell 17 in the direction of static magnetic field application is subjected to lock-in detection by utilizing phase fluctuation in the output from the lock-in amplifier 22.

Figure 3:
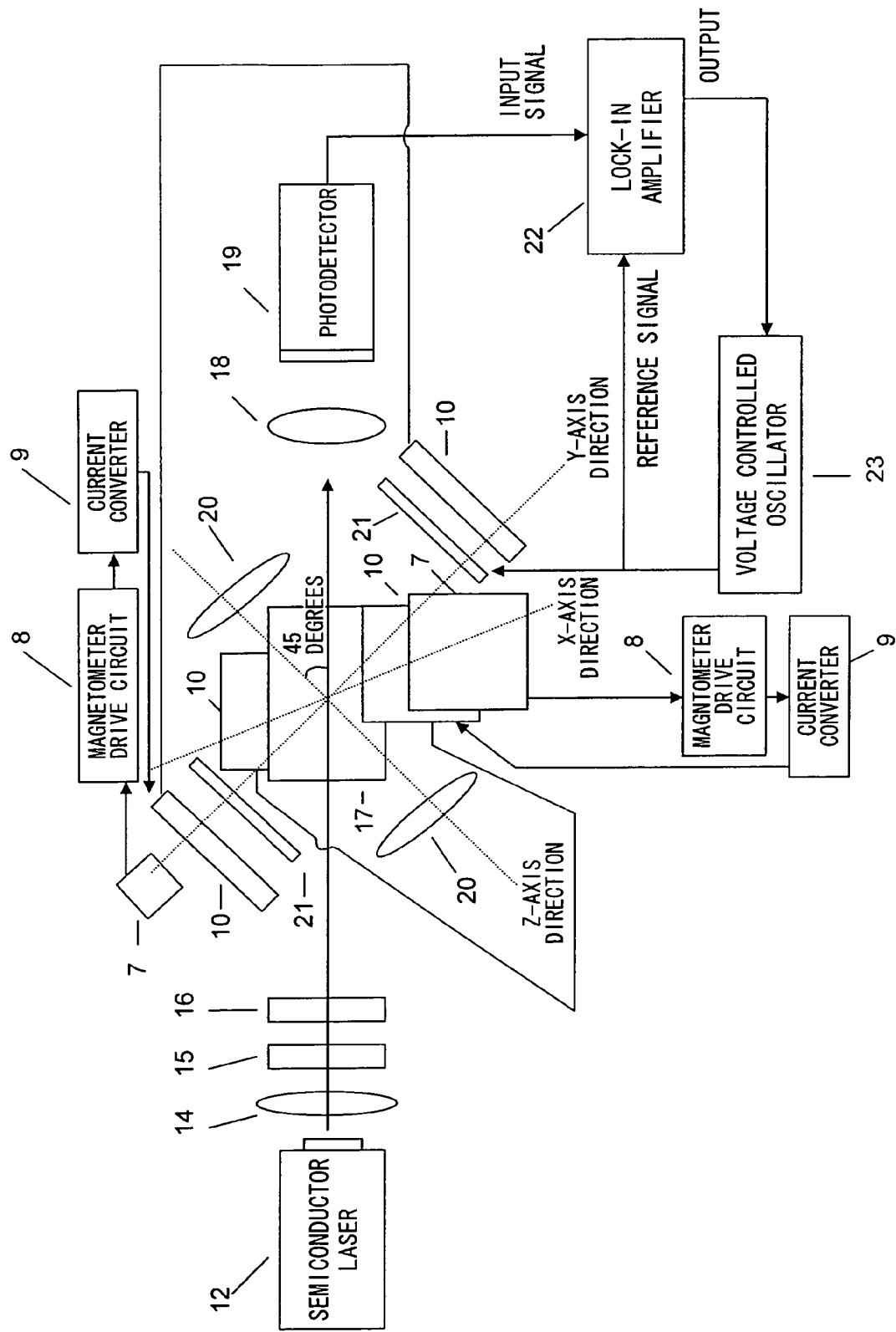
FIG. 3 is a diagram showing a configuration example of a magnetic field measurement device in the case of a first example of the present invention.

FIG. 3 is a diagram showing a configuration example of a magnetic field measurement system in the case of a first example of the present invention. Spot beam from the semiconductor laser 12 having only one of wavelengths of a $D_1$ transition and a $D_2$ transition in an emission band, the $D_1$ transition and the $D_2$ transition being absorption spectral lines of the alkali metal atoms inside the vapor cell 17, is converted into parallel beam by use of the collimating lens 14, and is then converted into circularly polarized beam by allowing the parallel beam to pass through the polarizer 15 and the wavelength plate 16. The circularly polarized beam thus obtained is irradiated onto the vapor cell 17 to which the static magnetic field $B_0$ is applied by use of the Helmholtz coils 20, thereby generating a polarized state where the atoms in the vapor cell 17 are aligned to a specific ground level. At this time, the oscillating magnetic field $B_{RF}$ having the same frequency as the precession frequency of the atoms inside the cell is applied from the RF coils 21 to the plane orthogonal to the static magnetic field $B_0$ through the voltage controlled oscillator 23, thereby causing optical magnetic resonance to occur, and causing the polarized state to disappear. The beam transmitted through the cell is decreased since beam absorption by the atoms inside the cell emerges along with the disappearance of polarization. The optical magnetic resonance phenomenon attributable to RF modulation of the oscillating magnetic field $B_{RF}$ is subjected to lock-in detection using the lock-in amplifier 22 by utilizing a phase difference between the output electric signal from the photodetector 19 and the output signal from the voltage controlled oscillator 23 for RF modulation, and variation of the magnetic field is obtained from phase swinging.

The Helmholtz coils 20 are disposed so as to generate the static magnetic field $B_0$ in the center of the vapor cell 17 and in a direction (Z-axis direction) at an angle of 45 degrees to the laser beam passing through the vapor cell 17. In addition, the RF coils 21 are disposed so as to apply the oscillating magnetic field $B_{RF}$ in a direction (X-axis direction or Y-axis direction) orthogonal to the Z-axis direction. Here, fluxgate magnetometers 7 and magnetic field generating coils 10 are respectively disposed in positions in the Y-axis direction and in the X-axis direction. Moreover, the respective fluxgate magnetometers 7 and the respective magnetic field generating coils 10 are located in the same directions as the Helmholtz coils 20 and the RF coils 21 but away from the vapor cell 17. Environmental magnetic noise entering in the Y-axis direction and environmental magnetic noise entering in the X-axis direction are detected with the respective fluxgate magnetometers 7, and an electric signal outputted from a magnetometer drive circuit 8 is inputted to the magnetic field generating coils 10 through the current converter 9.

In the case of the magnetic field measurement device of this example, the environmental magnetic noise in the X-axis direction and the environmental magnetic noise in the Y-axis direction are cancelled out by use of magnetic fields generated by the magnetic field generating coils 10. In this way, it is possible to apply the stable static magnetic field $B_0$ and the stable oscillating magnetic field $B_{RF}$ to the vapor cell 17 at any time.

Figure 4:
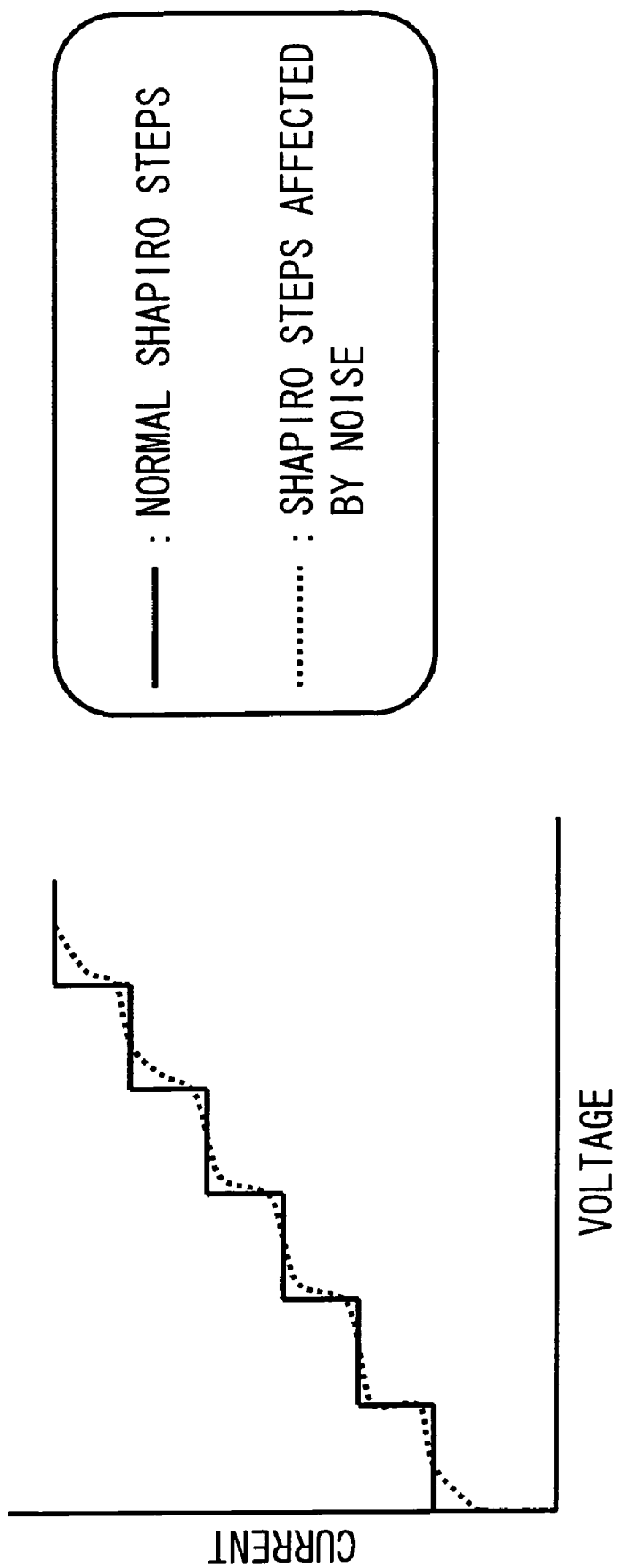
FIG. 4 is a graph showing noise rounding of a voltage-current characteristic of the SQUID magnetometer, the noise rounding being attributable to an oscillating magnetic field.

It is preferable to limit the frequency band of the oscillating magnetic field $B_{RF}$ of the optical pumping magnetometer used as the reference sensor so as to eliminate influences to the biomagnetic signal and the SQUID magnetometer. Since a frequency band of the biomagnetic signal from the brains or the heart to be the measurement object in the biomagnetic measurement ranges of 0.1 to 200 Hz, it is possible to avoid misidentification as the biomagnetic signal if the frequency band of the oscillating magnetic field $B_{RF}$ is set in a range grater than 200 Hz. Moreover, the SQUID magnetometer includes a Josephson junction (JJ: a superconducting junction) inside the SQUID, and the JJ creates Shapiro steps (a step-like structure that appears in a current-voltage characteristic upon application of a voltage containing a direct-current component and an alternating-current component to the JJ) of several megahertz. When the oscillating magnetic field $B_{RF}$ of several megahertz enters from outside, there arises a phenomenon called noise rounding where corners of the Shapiro steps are rounded, and this phenomenon hinders normal operation of the SQUID magnetometer (FIG. 4). For this reason, it is necessary to set the frequency band of the oscillating magnetic field $B_{RF}$ smaller than 1 MHz. In other words, the frequency band ($\omega$) of the oscillating magnetic field $B_{RF}$ of the optical pumping magnetometer used as the reference sensor is preferably set in the range of 200 Hz $<\omega<$1 MHz.

The frequency of the oscillating magnetic field $B_{RF}$ is determined by the static magnetic field intensity to be applied to the vapor cell and by the type of the alkali metal inside the vapor cell. The alkali metal to be filled in the vapor cell mainly includes cesium ($^{133}$Cs), rubidium ($^{85}$Rb or $^{87}$Rb), potassium ($^{39}$K or $^{41}$K) or the like. In the optical pumping magnetometer of the present invention, the static magnetic field intensity to be applied to the vapor cell is preferably set in a range of about 57.14 nT to 285.71 μT when using $^{133}$Cs as the alkali metal in the vapor cell, in a range of about 42.85 nT to 214.27 μT when using $^{85}$Rb, in a range of about 28.57 nT to 142.85 μT when using $^{87}$Rb, in a range of about 28.57 nT to 142.85 μT when using $^{39}$K, or in a range of about 28.57 nT to 142.85 μT when using $^{41}$K.

Figure 5:
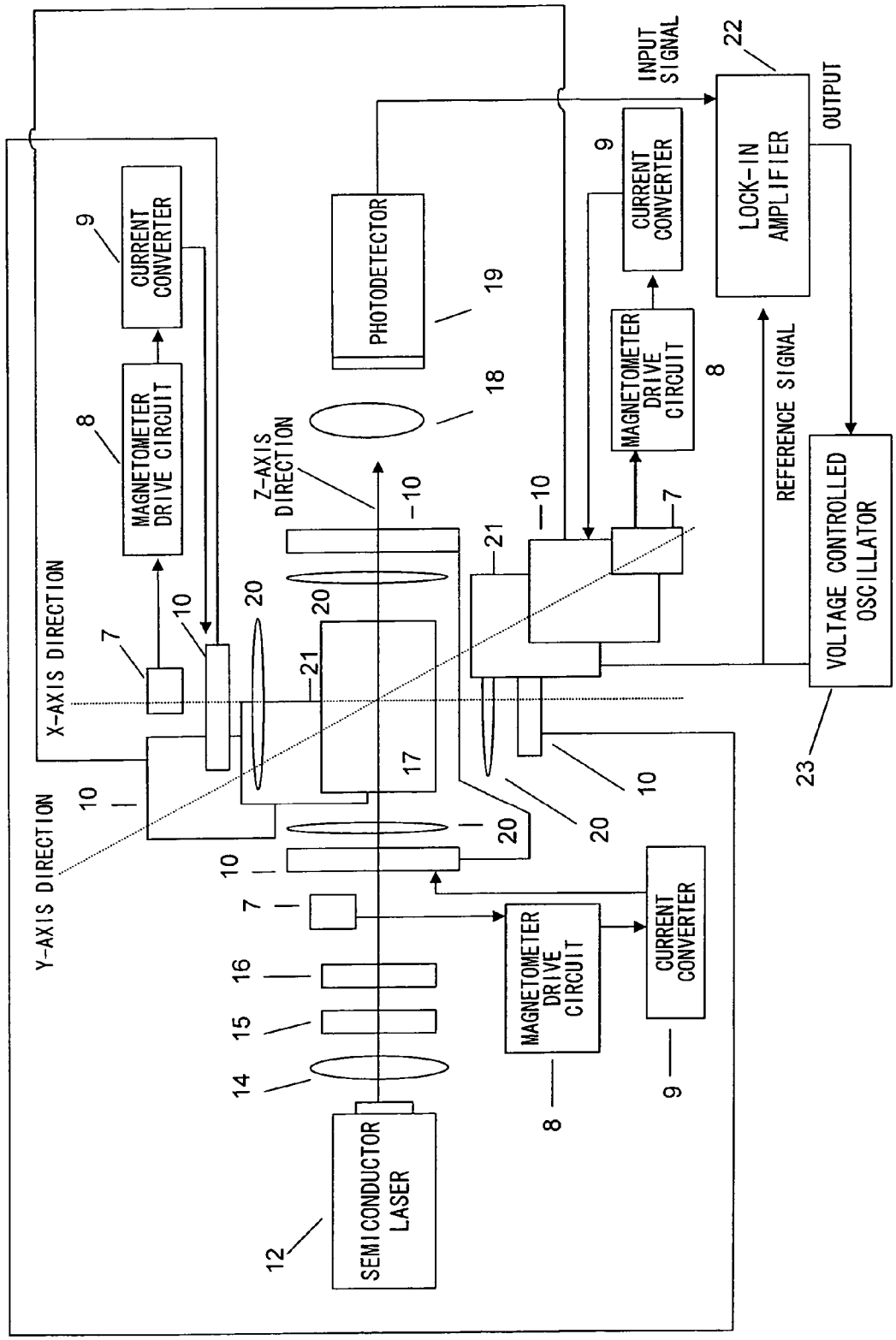
FIG. 5 is a diagram showing a configuration example of a magnetic field measurement device in the case of a second example of the present invention.

FIG. 5 is a diagram showing a configuration example of a magnetic measurement system in the case of a second example of the present invention. In the magnetic measurement system of the second example, the layout of the Helmholtz coils 20, the fluxgate magnetometers 7 and the magnetic field generating coils 10 is different from the layout thereof in the first example.

Two pairs of the Helmholtz coils 20 are disposed so as to generate the static magnetic field $B_0$ in the center of the vapor cell 17 and in a direction (Z-axis direction) of the laser beam passing through the vapor cell 17 as well as in a direction (X-axis direction or Y-axis direction) orthogonal to the direction. In addition, the RF coils 21 are disposed so as to generate the oscillating magnetic field $B_{RF}$ in the other direction (the Y-axis direction or the X-axis direction) orthogonal to the Z-axis direction. The static magnetic field $B_0$ to be applied to the vapor cell 17 is equivalent to a vectorial sum of static magnetic fields generated by the two pairs of Helmholtz coils 20, and an angle formed by the laser beam and the static magnetic field $B_0$ is adjusted to 45 degrees by changing the static magnetic intensities from the respective Helmholtz coils 20. The fluxgate magnetometers 7 and the magnetic field generating coils 10 are disposed in positions in the same directions as the respective Helmholtz coils 20 and the RF coils 21 but away from the vapor cell 17. Environmental magnetic noise entering in the X-axis direction, environmental magnetic noise entering in the Y-axis direction, and environmental magnetic noise entering in the Z-axis direction are detected with the fluxgate magnetometers 7, and electric signals outputted from the respective magnetometer drive circuits 8 are inputted to the magnetic field generating coils 10 through the current converters 9.

In the case of the magnetic field measurement device of this example, the environmental magnetic noise in the X-axis direction, the environmental magnetic noise in the Y-axis direction, and the environmental magnetic noise in the Z-axis direction are cancelled out by use of the magnetic fields generated by the magnetic field generating coils 10. In this way, it is possible to apply the stable static magnetic field $B_0$ and the stable oscillating magnetic field $B_{RF}$ to the vapor cell 17 at any time.

Figure 6:
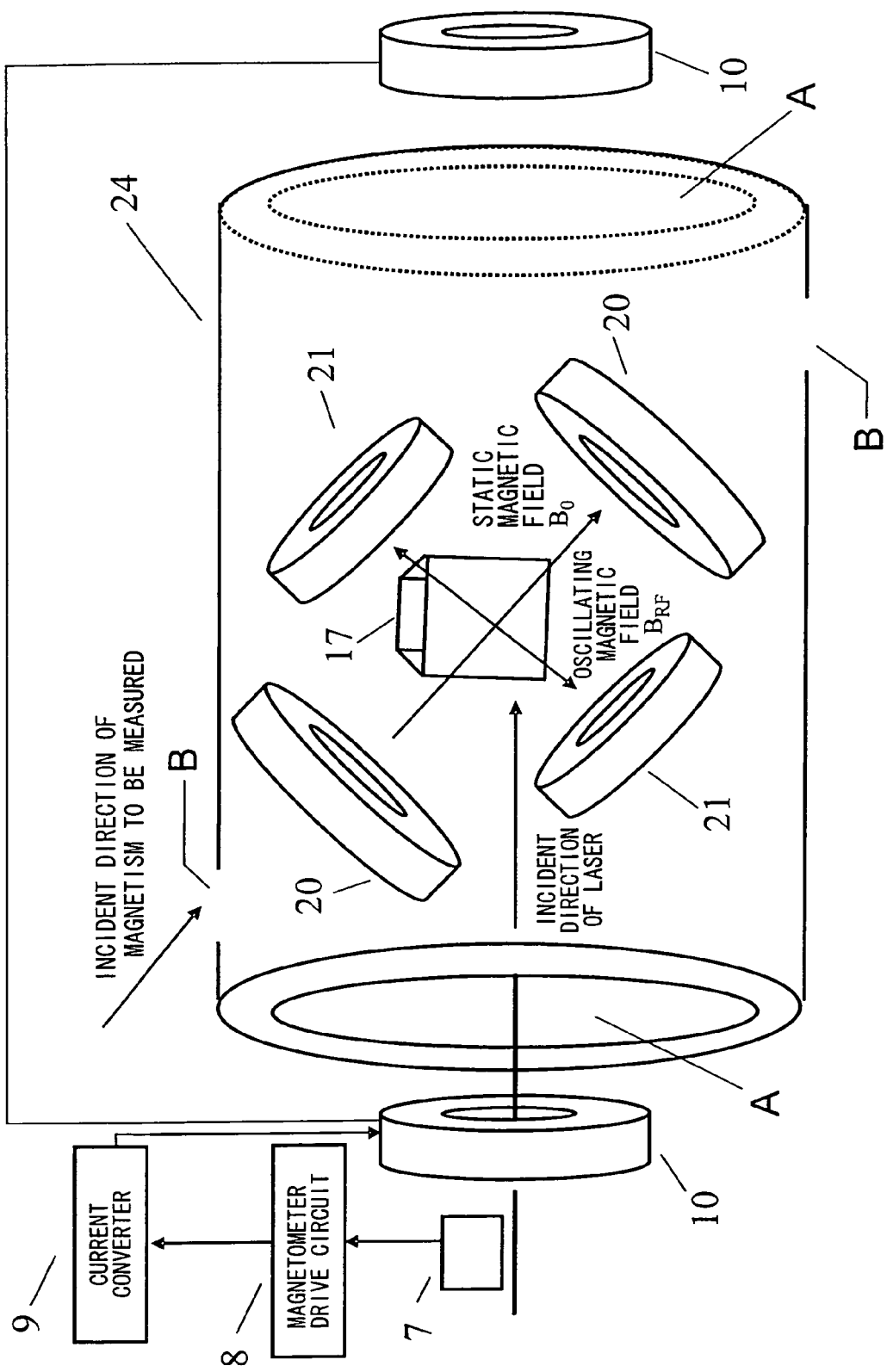
FIG. 6 is a diagram showing a configuration example of a magnetic field measurement device in the case of a third example of the present invention.

FIG. 6 is a diagram showing a configuration example of a magnetic measurement system in the case of a third example of the present invention. In this example, the vapor cell 17, the Helmholtz coils 20 and the RF coils 21 are housed in a cylinder 24 made of a metal having fine magnetic permeability such as Permalloy or Mumetal to shield environmental magnetic noise entering the vapor cell 17. Note that the size of the cylinder 24 depends on the sizes of the vapor cell 17, the Helmholtz coils 20 and the RF coils 21 housed therein. Accordingly, the cylinder 24 need be large enough to house all of the vapor cell 17, the Helmholtz coils 20 and the RF coils 21 completely. The laser beam is made incident on the vapor cell 17 through a hole A of the cylinder 24. Then, the environmental magnetic noise entering from the hole A is detected with the fluxgate magnetometer 7 disposed in front of the hole A, and an electric signal outputted from the magnteometer drive circuit 8 is inputted to the magnetic field generating coils 10 through the current converter 9.

The environmental magnetic noise entering from the hole A is cancelled out by the magnetic field generated by the magnetic field generating coils 10, and it is thereby possible to apply the stable static magnetic field $B_0$ and the stable oscillating magnetic field $B_{RF}$ to the vapor cell 17 at any time. Moreover, holes B in the same size as the vapor cell 17 used therein are formed in a side surface of the cylinder 24, and magnetism for measurement is made incident through the holes B. In the case of this example, using the cylinder 24 makes it possible not only to block an influence of the environmental magnetic noise entering the vapor cell 17 but also to prevent the oscillating magnetic field $B_{RF}$ emitted from the RF coils 21 from leaking out. As a result, when performing measurement of a cardiac magnetic field on a pacemaker-implanted patient undergoing a therapy for cardiac conduction disturbance or arrhythmia, it is also possible to suppress an adverse effect of the oscillating magnetic field $B_{RF}$ to a pacemaker.

Figure 7:
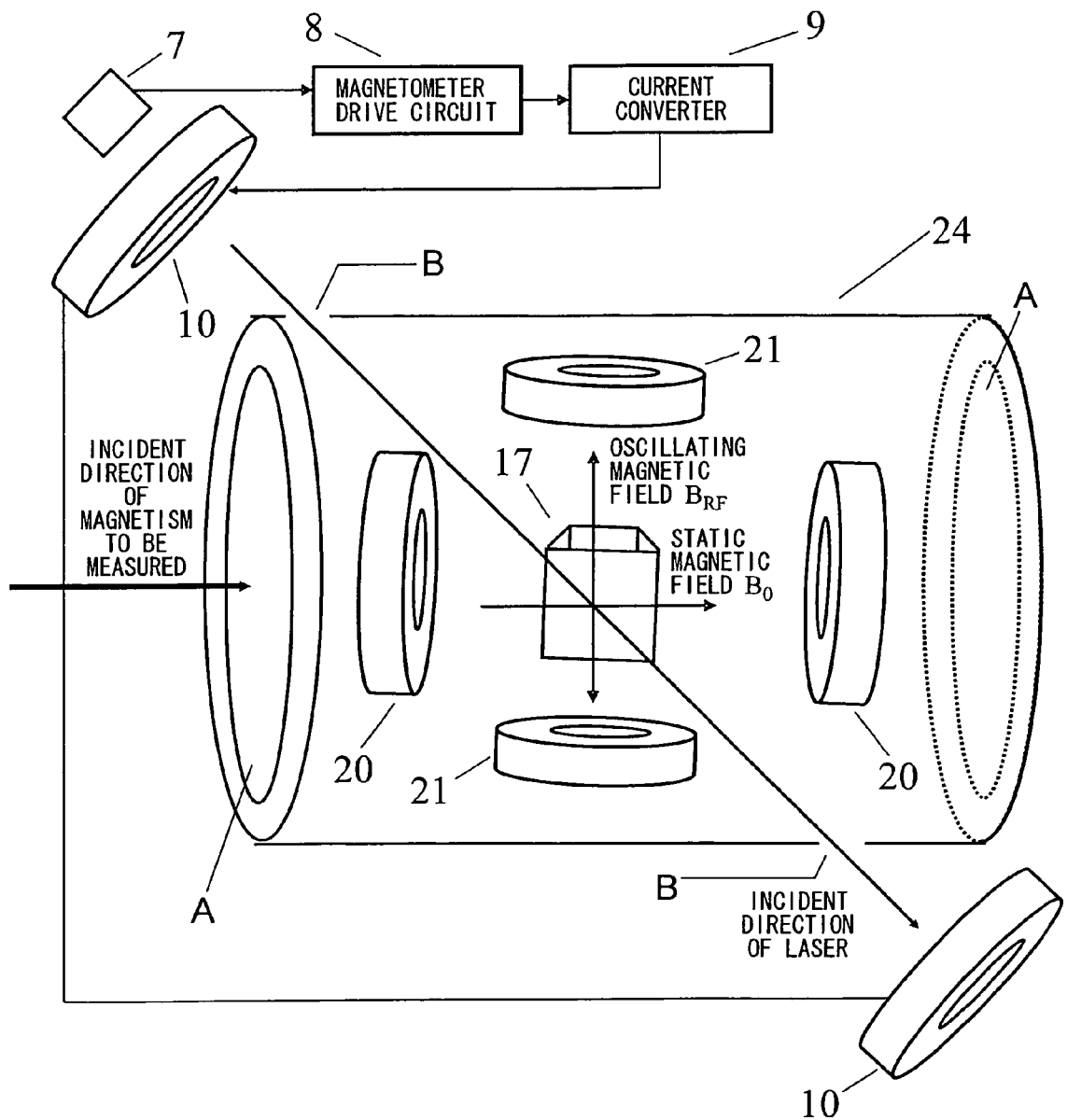
FIG. 7 is a diagram showing a configuration example of a magnetic field measurement device in the case of a fourth example of the present invention.

FIG. 7 is a diagram showing a configuration example of a magnetic field measurement system in the case of a fourth example of the present invention. In this example, the vapor cell 17, the Helmholtz coils 20 and the RF coils 21 are housed in the cylinder 24 as in the case of the third example. The static magnetic field $B_0$ from the Helmholtz coils 20 is applied to the vapor cell 17 in the direction of the hole A of the cylinder 24, and the oscillating magnetic field $B_{RF}$ from the RF coils 21 is applied to the vapor cell 17 in the direction orthogonal to the static magnetic field $B_0$. In addition, the laser beam is made incident on the vapor cell 17 through one of the holes B provided on the side surface, the holes B being in the same size as a diameter of the laser beam used therein. The environmental magnetic noise entering from the holes B is detected with the fluxgate magnetometer 7 disposed in front of one of the holes B on the side surface of the cylinder 24, and an electric signal outputted from the magnetometer drive circuit 8 is inputted to the magnetic field generating coils 10 through the current converter 9.

In the case of this example, the environmental magnetic noise entering from the holes B is cancelled out by use of the magnetic field generated by the magnetic field generating coils 10. In this way, it is possible to apply the stable static magnetic field $B_0$ and the stable oscillating magnetic field $B_{RF}$ to the vapor cell 17 at any time. Moreover, the magnetism for measurement is made incident through the hole A.

Although some examples of the present invention have been described so far, it is by all means possible to embody other aspects. For example, in the configuration examples shown in the third and fourth examples, it also serves the purpose that the environmental magnetic noise entering from two directions orthogonal to the static magnetic field $B_0$ at the vapor cell 17 as the center is detected with the fluxgate magnetometer 7 disposed outside the cylinder 24, the static magnetic field $B_0$ being applied to the vapor cell 17, and that the electric signal outputted from the magnetometer drive circuit 8 is inputted to the magnetic field generating coils 10 through the current converter 9. The environmental magnetic noise entering the cylinder 24 is cancelled out by use of the magnetic field generated by the magnetic field generating coils 10. In this way, it is possible to apply the stable static magnetic field $B_0$ and the stable oscillating magnetic field $B_{RF}$ to the vapor cell 17 at any time.

Furthermore, the vapor cell 17 is filled with an alkali metal gas, and collisions of the atoms occurring at the time of irradiating the laser beam on the vapor cell 17 may hinder efficient optical pumping of the atoms in some cases. Moreover, collisions of the excited atoms on an inner wall of the vapor cell may hinder the optical pumping in some cases. For this reason, it is preferable to alleviate the collisions of the atoms by filling the vapor cell 17 with a rare gas such as neon, helium, argon or xenon, or a nonmagnetic gas such as hydrogen or nitrogen. It is also effective to coat the inner wall of the vapor cell 17 with a nonmagnetic material such as paraffin in order to alleviate the collisions of the alkali metal atoms on the inner wall of the vapor cell 17. The vapor cell 17 subjected to these processes contributes to highly efficient optical pumping. Accordingly, it is possible to suppress the output of the light source such as the semiconductor laser 12 and thereby to contribute to suppressing costs of the light source. The above-described vapor cell 17 configured to achieve highly efficient optical pumping is effective in any of the examples.

The semiconductor laser 12 is the most preferable light source used herein because it is possible to achieve operations, outputs and a wavelength range, which are stable. However, it is also possible to use a light emitting diode (LED) or a lamp for the optical pumping magnetometer using the vapor cell 17 coated with the nonmagnetic material. The LED or the lamp has an advantage such as a lower price than the semiconductor laser 12. When using the lamp, since the lamp has a wider emission wavelength range as compared to the semiconductor laser 12 or the LED, it is necessary to obtain either the $D_1$ transition or the $D_2$ transition of the spectral lines intended for use by causing the emitted light from the lamp to pass through an optical filter. Moreover, in a case where the emitted light from the semiconductor laser 12 or the LED used therein contains both of the $D_1$ transition and the $D_2$ transition, only one of the spectral lines is similarly obtained by causing the light to pass through the optical filter. In this way, the use of the LED or the lamp instead of the semiconductor laser 12 as the light source for operating the optical pumping magnetometer, and the use of the optical filter are applicable to any of the examples.

Moreover, in the above-described examples, it is also possible to generate a rotational magnetic field in combination of an oscillating magnetic field $B_{RF}$ having a phase shifted by 90 degrees by use of two pairs of RF coils 21 disposed in the two directions orthogonal to the static magnetic field $B_0$, instead of generating the high-frequency oscillating magnetic field $B_{RF}$ by use of the single pair of RF coils 21. The rotational magnetic field intensity may be set to a half of the oscillating magnetic field intensity as compared to the case of using the high-frequency oscillating magnetic field $B_{RF}$.

Figure 8:
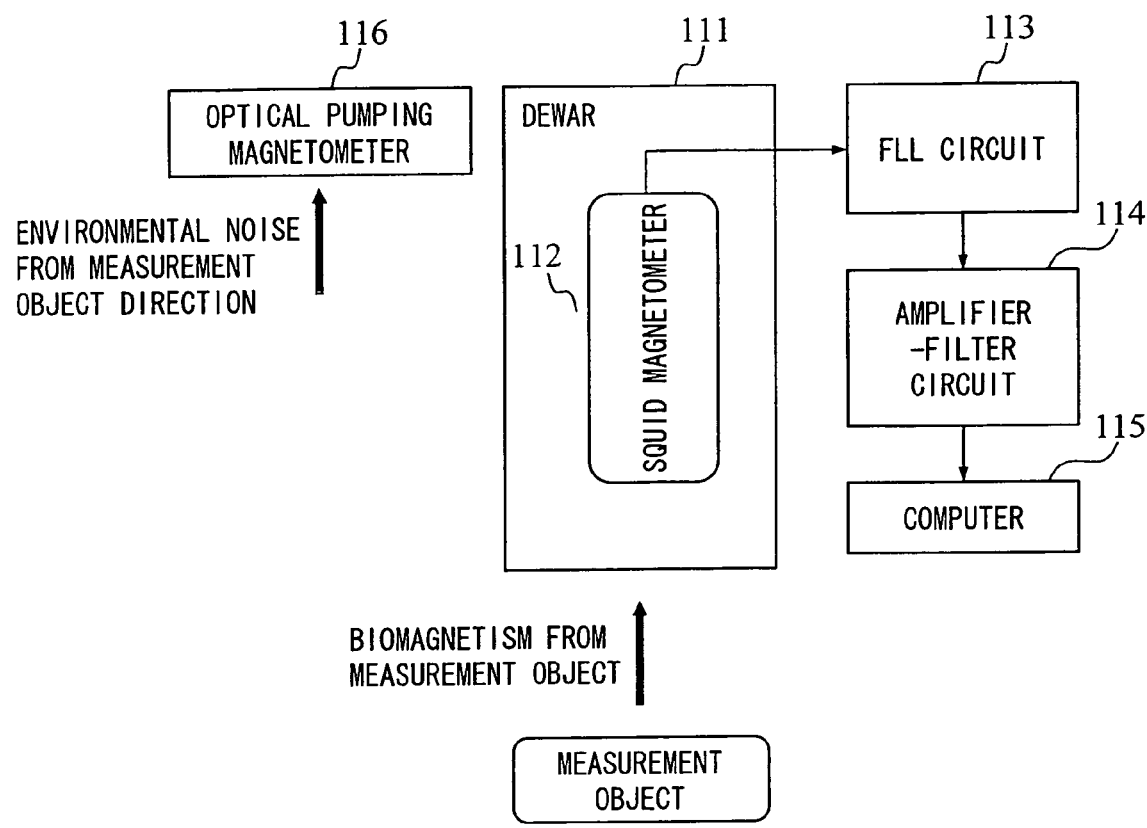
FIG. 8 is a diagram showing a configuration example of a magnetic field measurement system of the present invention configured by combining a SQUID magnetometer and an optical pumping magnetometer.

FIG. 8 is a configuration diagram showing a magnetic field measurement system in the case of the present invention, in which a SQUID magnetometer 112 is used for biomagnetic measurement while an optical pumping magnetometer 116 is used for environmental magnetic noise measurement. The SQUID magnetometer 112 is housed in a Dewar 111 filled with liquid helium (or liquid nitrogen). A biomagnetic signal from a measurement object measured with the SQUID magnetometer 112 is converted into an electric signal by a flux locked loop circuit (an FLL circuit, which is equivalent to a SQUID magnetometer drive circuit) 113, and is processed into a signal in an optimal frequency band by use of an amplifier-filter circuit 114. Then, the signal is collected by a computer 115. Environmental magnetic noise in the same direction as the biomagnetic signal from the measurement object is detected with an optical pumping magnetometer 116 disposed above the SQUID magnetometer 112.

Figure 9:
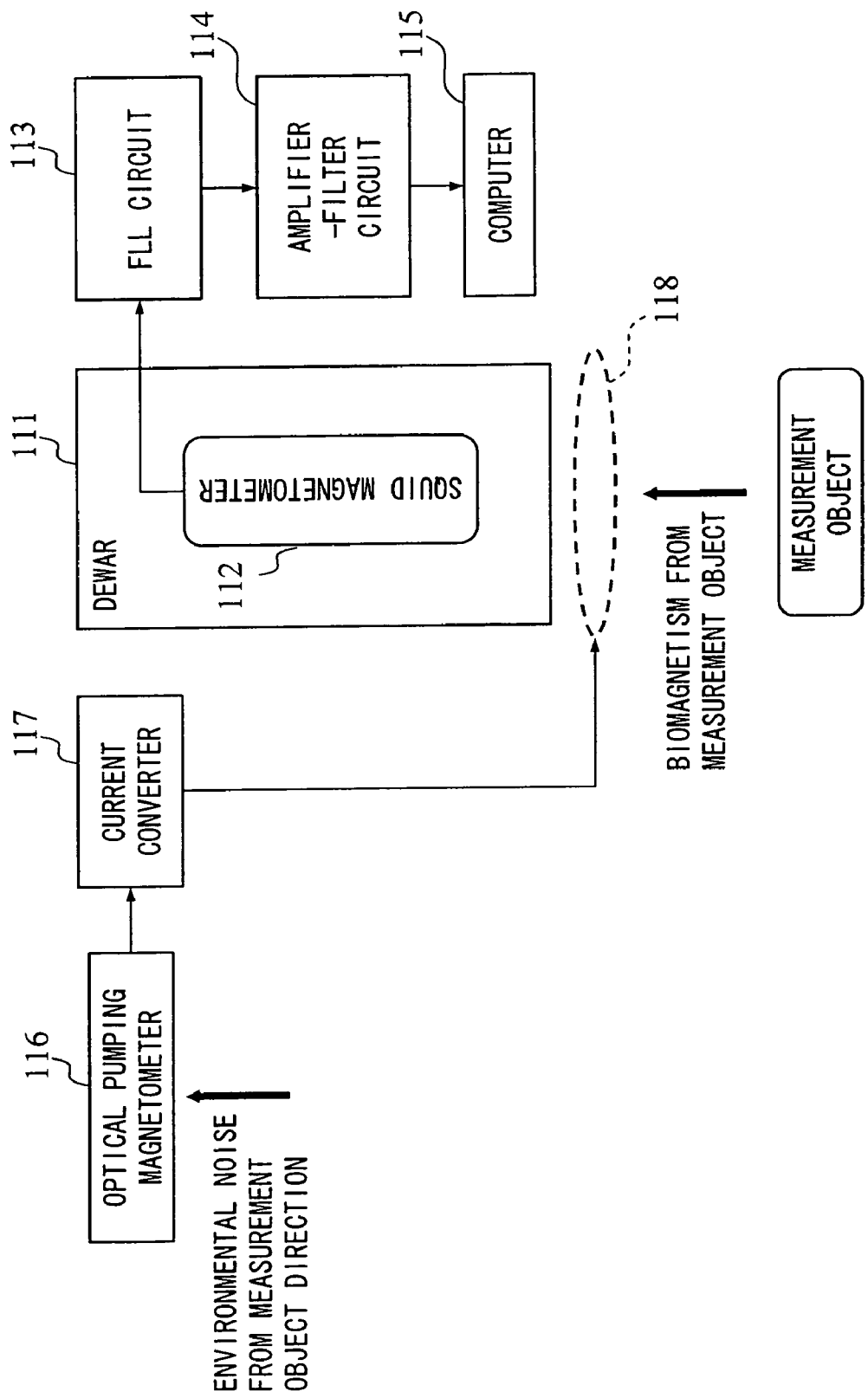
FIG. 9 is a diagram showing a configuration example of a biomagnetic measurement system of a SQUID magnetometer in which an optical pumping magnetometer is used as a reference sensor.

FIG. 9 is a diagram showing a configuration example of the present invention for removing the environmental magnetic noise entering the biomagnetic signal detected with the SQUID magnetometer 112 by use of the environmental magnetic noise detected with the optical pumping magnetometer 116. An environmental magnetic noise signal detected with the optical pumping magnetometer 116 is converted into an amount of a current by a current converter 117, and is transmitted to a magnetic field generating coil 118 disposed between the measurement object and the SQUID magnetometer 112. The environmental magnetic noise entering the SQUID magnetometer 112 is cancelled by causing the magnetic field generating coil 118 to generate a magnetic field in a phase opposite to, and in the same size as, the environmental magnetic noise in the same direction as the biomagnetism from the measurement object.

Figure 10:
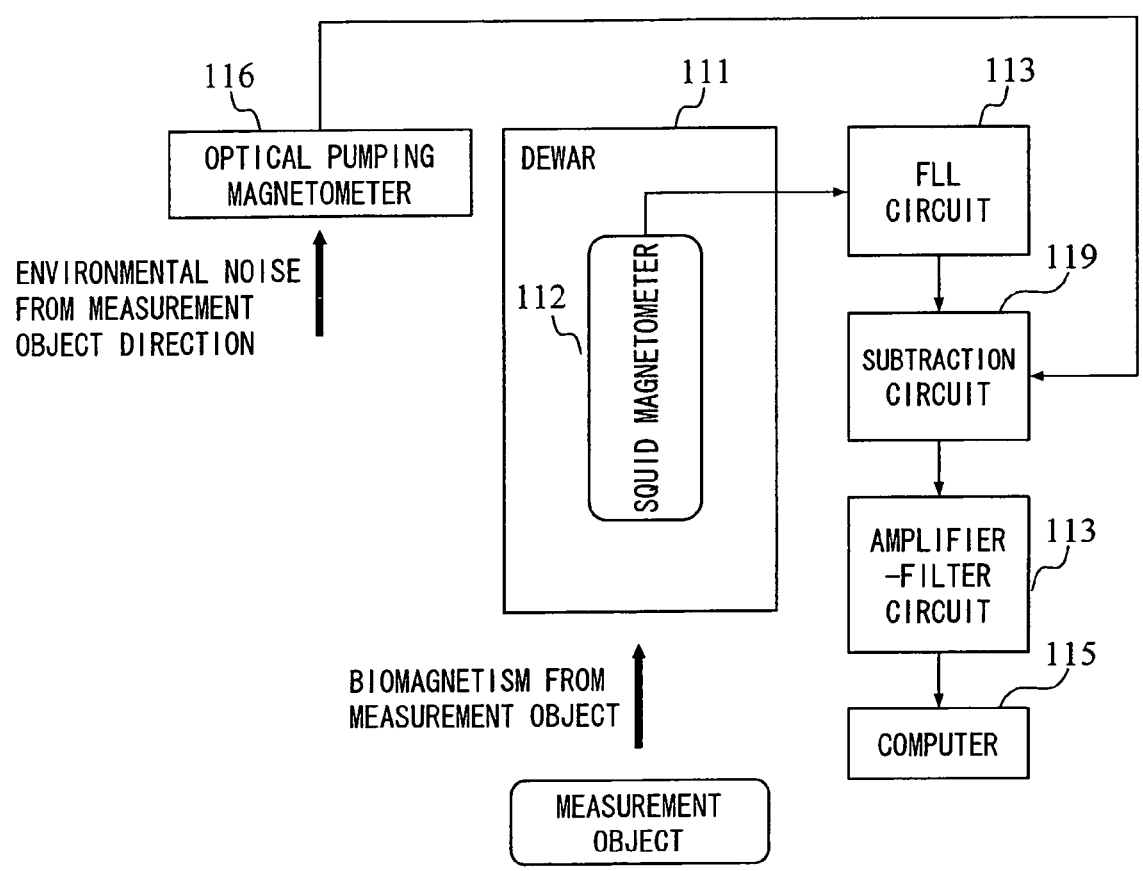
FIG. 10 is a diagram showing another configuration example of the biomagnetic measurement system of a SQUID magnetometer in which an optical pumping magnetometer is used as a reference sensor.

FIG. 10 is a diagram showing another configuration example of the present invention for removing the environmental magnetic noise entering the biomagnetic signal detected with the SQUID magnetometer 112 by use of the environmental magnetic noise detected with the optical pumping magnetometer 116. The biomagnetism detected with the SQUID magnetometer 112 is converted into the electric signal by use of the FLL circuit 113. The environmental magnetic noise entering the SQUID magnetometer 112 is cancelled by inputting the electric signal outputted from the optical pumping magnetometer 116 for detecting the environmental magnetic noise and the electric signal outputted from the FLL circuit 113 respectively to a subtraction circuit 119.

Figure 11:
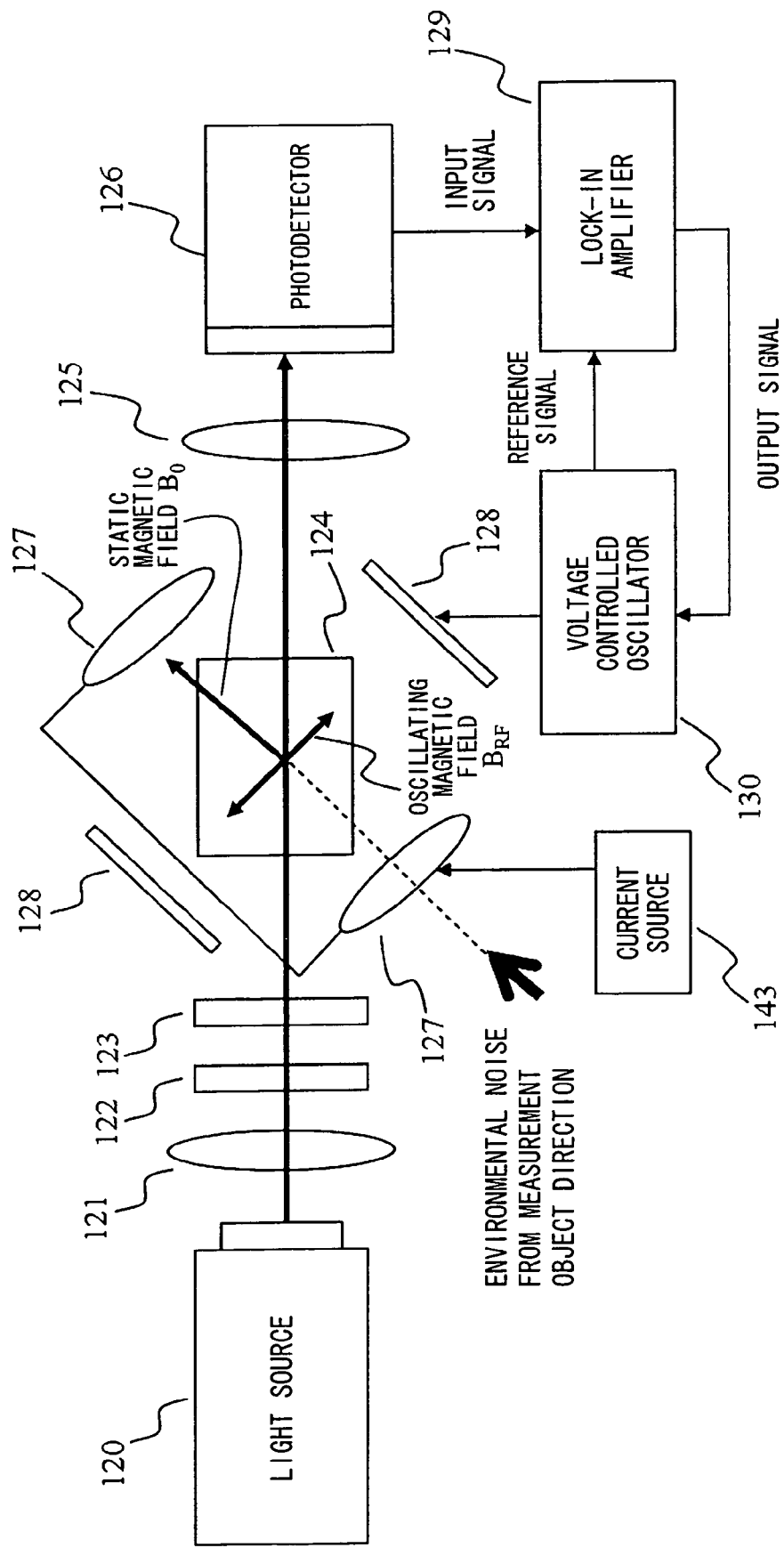
FIG. 11 is a diagram showing a configuration example of an optical-microwave resonance type optical pumping magnetometer.

A typical optical-microwave resonance type optical pumping magnetometer will be described with reference to FIG. 11. The optical-microwave resonance type optical pumping magnetometer includes: an optical system composed of a vapor cell 124 functioning as a magnetic field detector, a light source 120, a collimating lens 121, a polarizer 122, a wavelength plate 123, a condenser lens 125, and a photodetector 126; a magnetic system composed of static magnetic field applying coils 127 and RF coils 128; and a signal processing system composed of a lock-in amplifier 129 and a voltage controlled oscillator 130. A static magnetic field $B_0$ is applied to the vapor cell 124 filled with an alkali metal gas such as potassium, rubidium or cesium by use of the static magnetic field applying coils 127. At this time, an energy level of the alkali metal atoms inside the vapor cell 124 is split into a plurality of levels due to the Zeeman effect. Beam is irradiated from the light source 120 onto the vapor cell 124 in the state of static magnetic field application. At this time, the beam from the light source 120 is converted into parallel beam by the collimating lens 121, and circularly polarized beam generated by way of the polarizer 122 and the wavelength plate 123 is irradiated. The alkali metal atoms on the ground level subjected to Zeeman splitting by irradiation of the circularly polarized beam are excited, and then the level of the atoms returns from the excited level to the ground level along with energy deactivation. Once a sufficient time passed from the irradiation of the circularly polarized beam, the energy levels of the atoms inside the vapor cell 124 enter a polarized state occupied by specific ground levels. When the atoms are in the polarized state, the circularly polarized beam is not absorbed any longer.

The atoms in the polarized state are precessing proportionately with the intensity of the static magnetic field $B_0$ applied to the vapor cell 124. At this time, an oscillating magnetic field $B_{RF}$ is applied to a plane, which is orthogonal to the direction of static magnetic field application, through the voltage controlled oscillator 130 by use of the RF coils 128 disposed around the vapor cell 124. Here, when a precession frequency of the atoms coincides with a frequency of the oscillating magnetic field $B_{RF}$, the polarized state disappears due to optical magnetic resonance generated by oscillating magnetic field application, thereby the atoms restart to absorb the beam. The optical-microwave type optical pumping magnetometer is configured to utilize variation in transmitted light through the vapor cell 124, the variation being caused by the optical-microwave resonance attributable to RF modulation. The beam transmitted through the vapor cell 124 is detected by the photodetector 126 through the condenser lens 125, and is converted into an electric signal. The electric signal from the photodetector 126 is inputted to the lock-in amplifier 129 as an input signal while an electric signal from the voltage controlled oscillator 130 is inputted thereto as a reference signal. A magnetic field from the measurement object that enters the vapor cell 124 in the direction of static magnetic field application is subjected to lock-in detection by utilizing phase fluctuation in the output from the lock-in amplifier 129.

Figure 12:
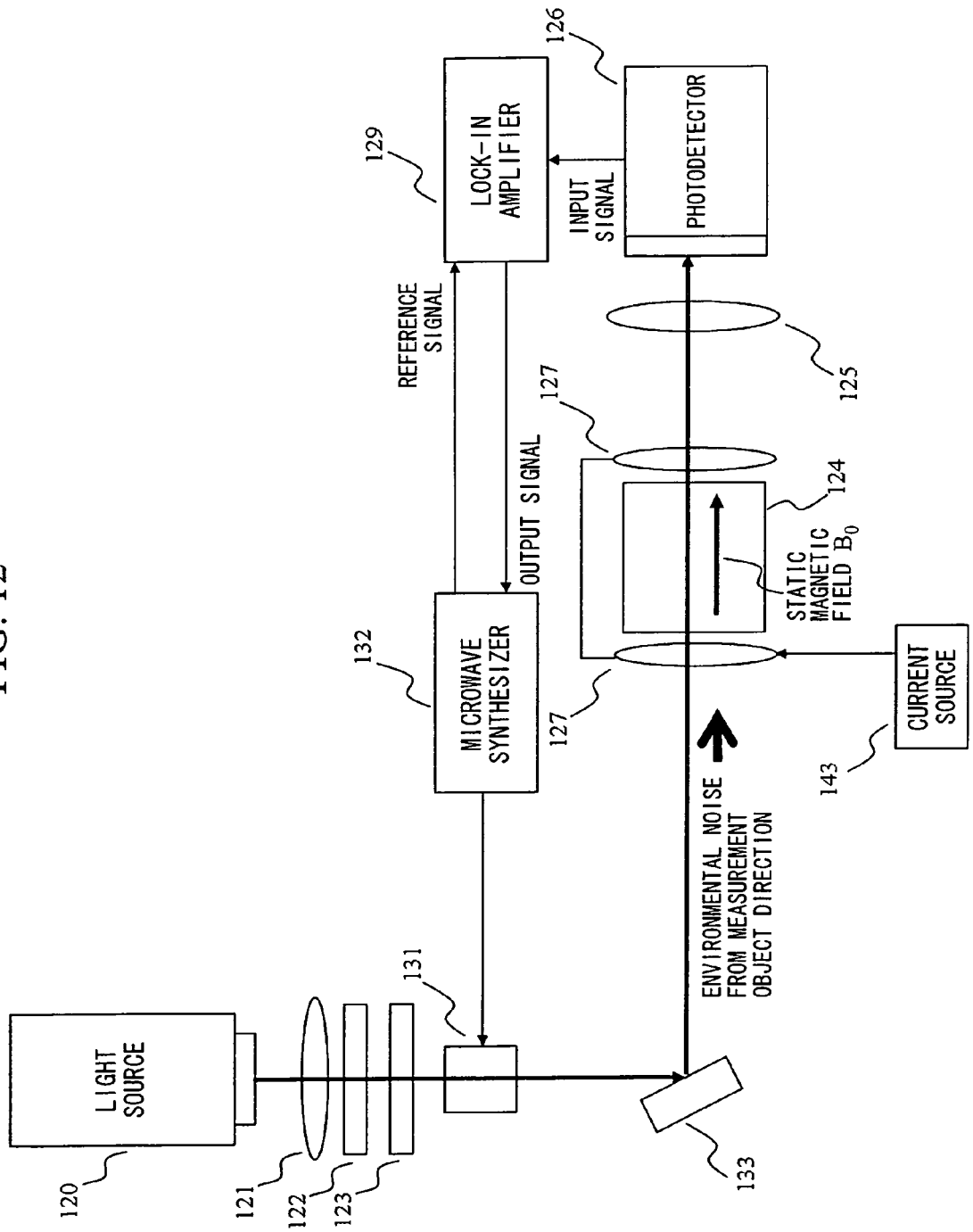
FIG. 12 is a diagram showing a configuration example of a coherent population trapping (CPT) resonance type optical pumping magnetometer.

A CPT resonance type optical pumping magnetometer of the present invention will be described with reference to FIG. 12. The CPT resonance type optical pumping magnetometer includes: the optical system composed of the vapor cell 124 serving as the magnetic field detector, the light source 120, the collimating lens 121, the polarizer 122, the wavelength plate 123, the condenser lens 125, and the photodetector 126; the magnetic system composed of the static magnetic field applying coils 127; an optical modulation system composed of an electro-optic modulator 131 and a microwave synthesizer 132; and the signal processing system composed of the lock-in amplifier 129. The static magnetic field $B_0$ is applied to the vapor cell 124 filled with an alkali metal gas such as potassium, rubidium or cesium by use of the static magnetic field applying coils 127. At this time, the energy level of the alkaline metal atoms inside the vapor cell 124 is split into a plurality of levels due to the Zeeman effect. Beam from the light source 120 is converted into parallel beam by the collimating lens 121, and is converted into the circularly polarized beam by way of the polarizer 122 and the wavelength plate 123. The circularly polarized beam is made incident on the electro-optic modulator 131 made of a ferroelectric optical crystal such as $LiNbO_3$. A high-frequency electric field is applied to the electro-optic modulator 131 by use of the microwave synthesizer 132, thereby the circularly polarized beam passing through the electro-optic modulator 131 is outputted as phase-modulated beam. The phase-modulated beam passing through the electro-optic modulator 131 is made incident on the vapor cell 124 by use of a reflecting mirror 133 in the same direction as the direction of static magnetic field application. The beam passing through the vapor cell 124 is detected with the photodetector 126 through the condenser lens 125.

When a frequency of the electric field to be applied to the electro-optic modulator 131 by use of the microwave synthesizer 132 coincides with energy among hyperfine structures of the alkali metal atoms subjected to Zeeman splitting, different energy transition factors of the alkali metal atoms excited by the phase-modulated light interfere with one another, thereby causing a CPT phenomenon in which the alkali metal atoms stop absorbing the phase-modulated light. The CPT resonance type optical pumping magnetometer is configured to utilize variation in transmitted light through the vapor cell 124, the variation being caused by the CPT resonance phenomenon that is created by the electro-optic modulator 131 and the microwave synthesizer 132. The phase-modulated light transmitted through the vapor cell 124 is detected by the photodetector 126 through the condenser lens 125, and is converted into an electric signal. The electric signal from the photodetector 126 is inputted to the lock-in amplifier 129 as an input signal while an electric signal from the microwave synthesizer 132 is inputted thereto as a reference signal. A magnetic field from the measurement object that enters the vapor cell 124 in the direction of static magnetic field application is subjected to lock-in detection by utilizing phase fluctuation in an output from the lock-in amplifier 129. Here, a state where a phase signal of the output from the lock-in amplifier 129 becomes equal to zero is defined as a locking point, while a phase signal shifted by a certain positive or negative value from the locking point is defined as an error signal. By feeding these signals back to the microwave synthesizer 132, an amplitude of a voltage inputted from the microwave synthesizer 132 to the electro-optic modulator 131 is modulated. In this way, the locking point is constantly maintained.

Figure 13:
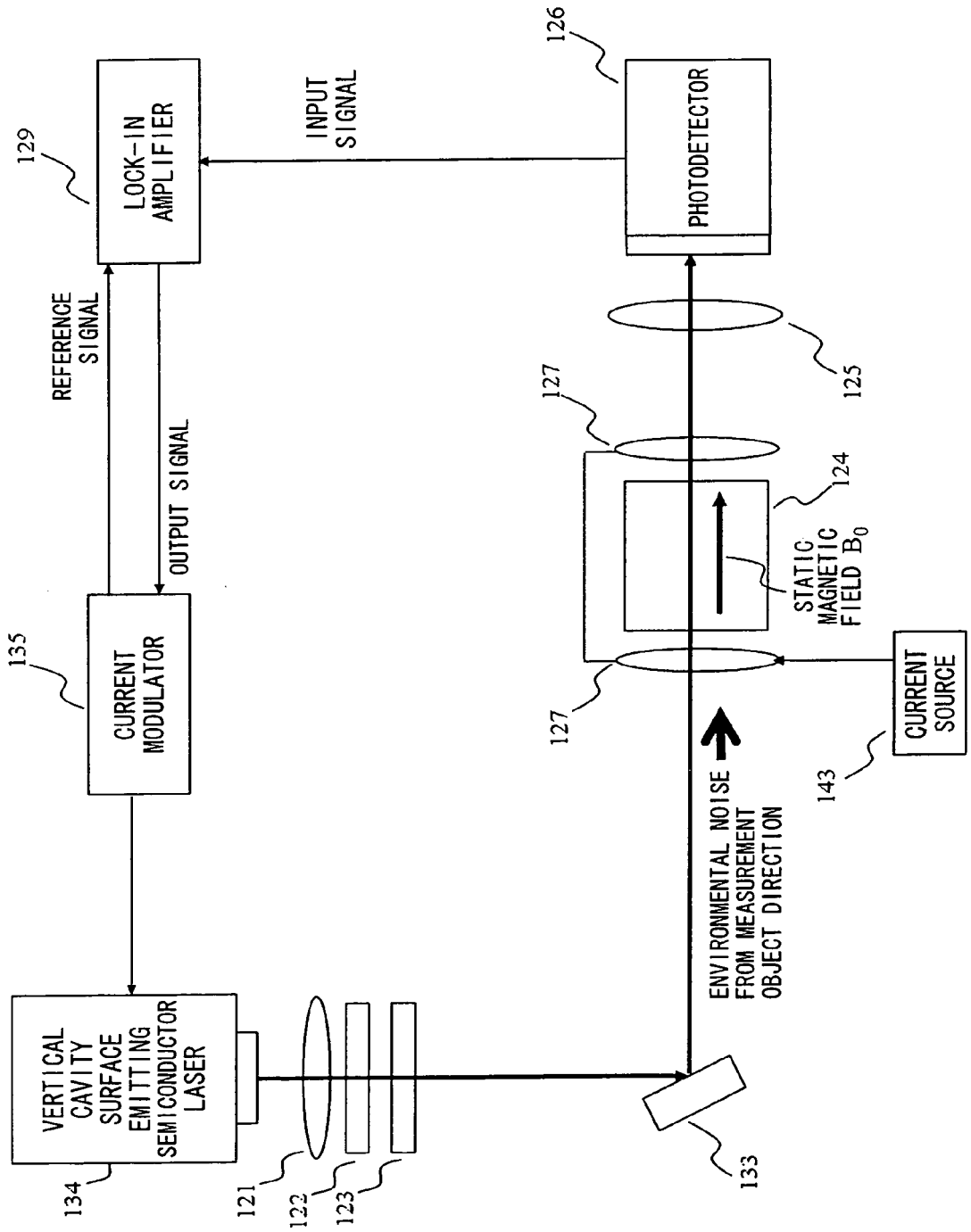
FIG. 13 is a diagram showing another configuration example of the CPT resonance type optical pumping magnetometer.

A typical CPT resonance type optical pumping magnetometer will be described with reference to FIG. 13. The CPT resonance type optical pumping magnetometer includes: the optical system composed of the vapor cell 124 serving as a magnetic field detector, a vertical cavity surface emitting semiconductor laser 134, the collimating lens 121, the polarizer 122, the wavelength plate 123, the condenser lens 125, and the photodetector 126; the magnetic system composed of the static magnetic field applying coils 127; the optical modulation system composed of a current modulator 135; and the signal processing system composed of the lock-in amplifier 129. The static magnetic field $B_0$ is applied to the vapor cell 124 filled with an alkali metal gas such as potassium, rubidium or cesium by use of the static magnetic field applying coils 127. At this time, the energy level of the alkaline metal atoms inside the vapor cell 124 is split into a plurality of levels due to the Zeeman effect. Beam from the vertical cavity surface emitting semiconductor laser 134 is converted into parallel beam by the collimating lens 121, and is converted into the circularly polarized beam by way of the polarizer 122 and the wavelength plate 123. At this time, a current modulated by the current modulator 135 is applied to the vertical cavity surface emitting semiconductor laser 134, thereby phase-modulated light is outputted from the vertical cavity surface emitting semiconductor laser 134. The phase-modulated light passing through the wavelength plate 123 is made incident on the vapor cell 124 by use of the reflecting mirror 133 in the same direction as the direction of static magnetic field application. The beam passing through the vapor cell 124 is detected with the photodetector 126 through the condenser lens 125.

When a frequency of the current to be applied to the vertical cavity surface emitting semiconductor laser 134 by use of the current modulator 135 coincides with the energy among the hyperfine structures of the alkali metal atoms subjected to Zeeman splitting, different energy transition factors of the alkali metal atoms excited by the phase-modulated light interfere with one another, thereby causing the CPT phenomenon in which the alkali metal atoms stop absorbing the phase-modulated beam. The CPT resonance type optical pumping magnetometer is configured to utilize variation in transmitted beam through the vapor cell 124, the variation being caused by the CPT resonance phenomenon that is created by the vertical cavity surface emitting semiconductor laser 134 and the current modulator 135. The phase-modulated beam transmitted through the vapor cell 124 is detected by the photodetector 126 through the condenser lens 125, and is converted into an electric signal. The electric signal from the photodetector 126 is inputted to the lock-in amplifier 129 as an input signal, while an electric signal from the current modulator 135 is inputted thereto as a reference signal. A magnetic field from the measurement object that enters the vapor cell 124 in the direction of static magnetic field application is subjected to lock-in detection by utilizing phase fluctuation in an output from the lock-in amplifier 129.

Figure 14:
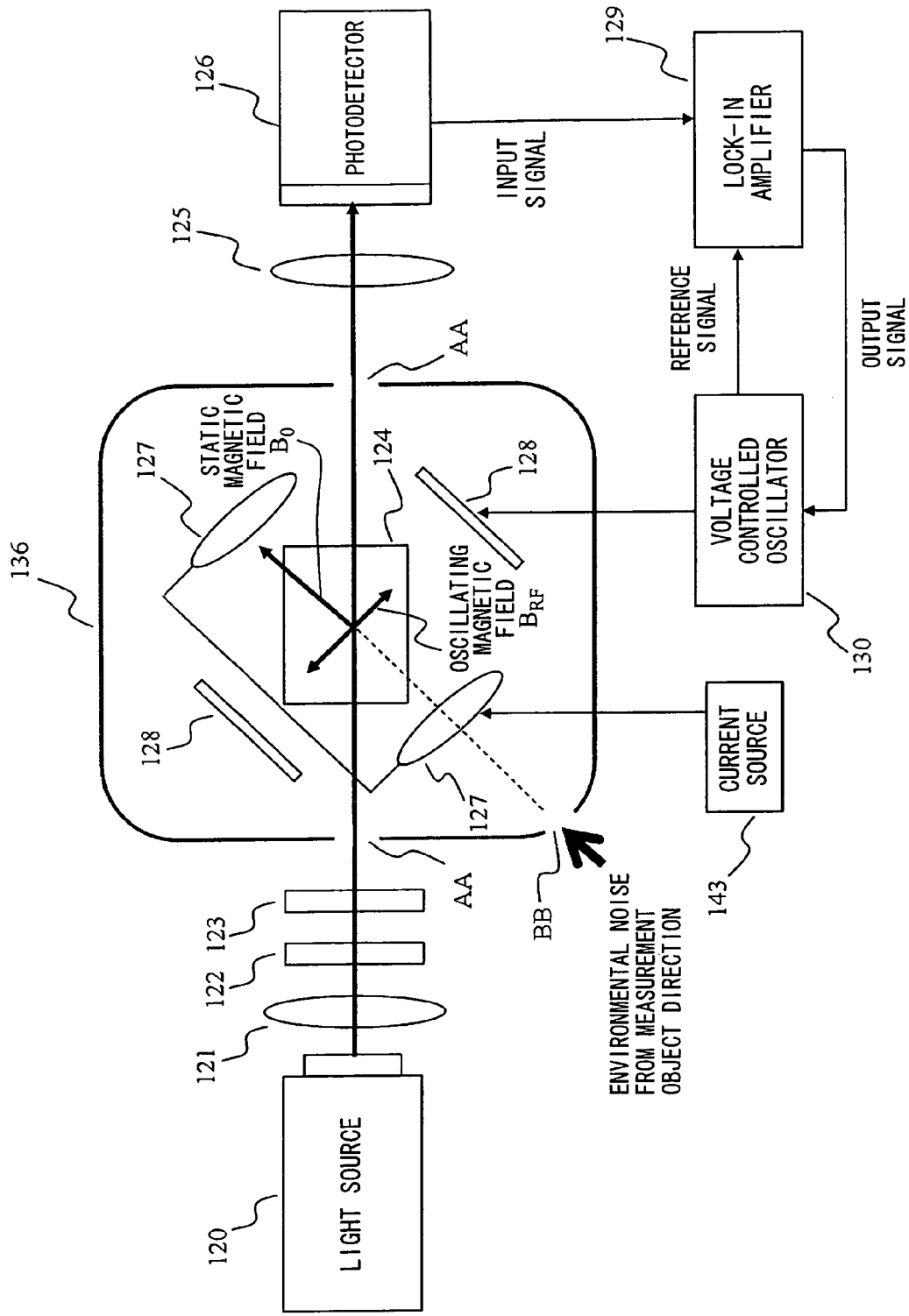
FIG. 14 is a diagram showing a configuration example of an optical-microwave resonance type optical pumping magnetometer provided with a magnetic shield case.

FIG. 14 is a diagram showing a configuration example of an optical-microwave resonance type optical pumping magnetometer in the case of the present invention. By housing only the magnetic system composed of the vapor cell 124 serving as the magnetic detector, the static magnetic field applying coils 127, and the RF coils 128 inside a magnetic shield case 136 made of metal having high magnetic permeability (such as Permalloy or Mumetal), it is possible to suppress environmental magnetic noise entering the vapor cell 124, the noise causing turbulences of the static magnetic field $B_0$ and the oscillating magnetic field $B_{RF}$. Moreover, the magnetic shield case 136 also has an effect to prevent an influence to the SQUID magnetometer caused by the oscillating magnetic field $B_{RF}$ entering the SQUID magnetometer as stray noise when using the combination of the SQUID magnetometer and the optical-microwave resonance type optical pumping magnetometer. In addition, when performing measurement of a cardiac magnetic field on a pacemaker-implanted patient undergoing a therapy for cardiac conduction disturbance or arrhythmia, it is possible to suppress an adverse effect of the oscillating magnetic field $B_{RF}$ to a pacemaker.

Figure 15:
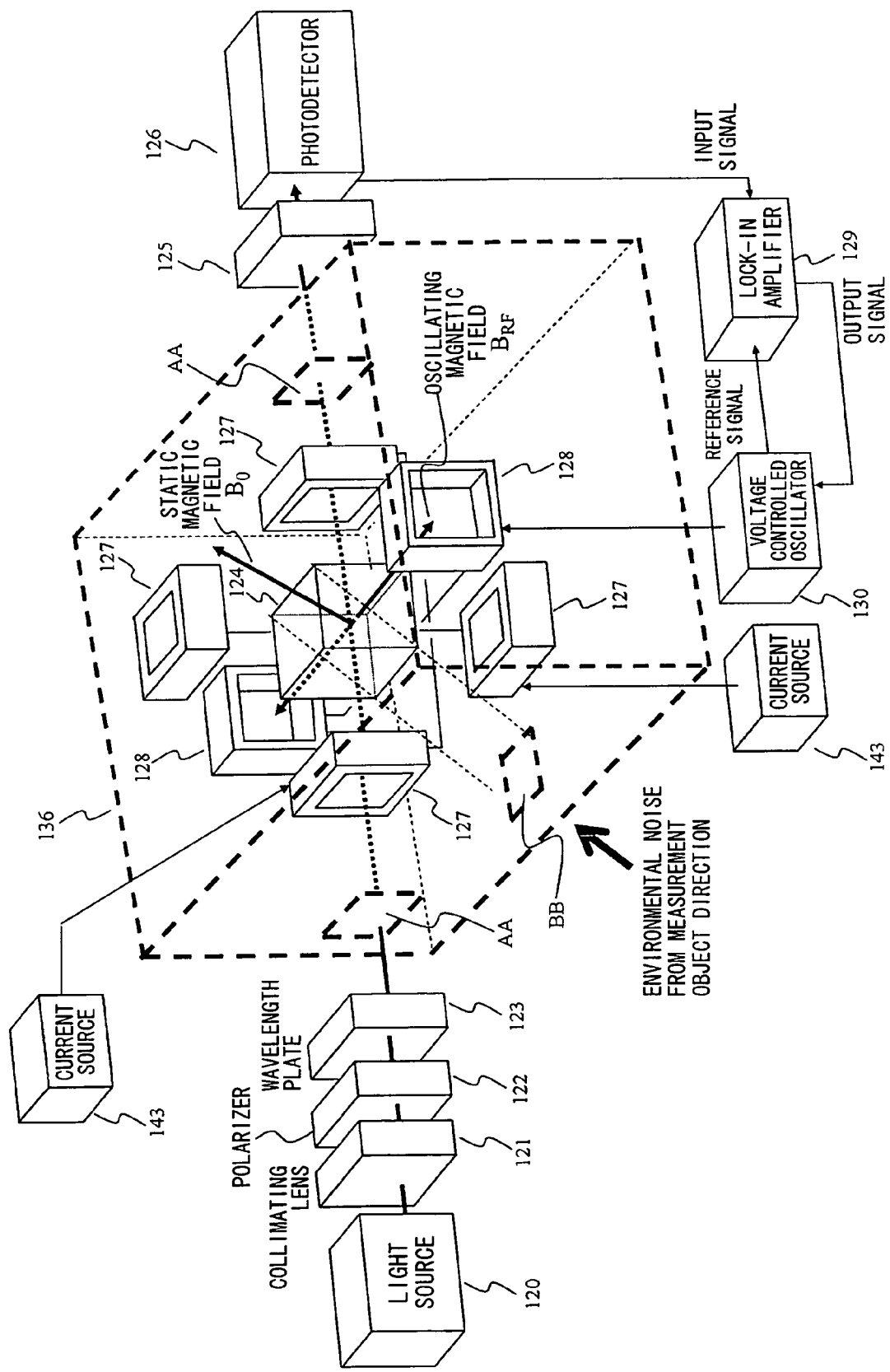
FIG. 15 is a diagram showing another configuration example of the optical-microwave resonance type optical pumping magnetometer provided with the magnetic shield case.
Figure 18:
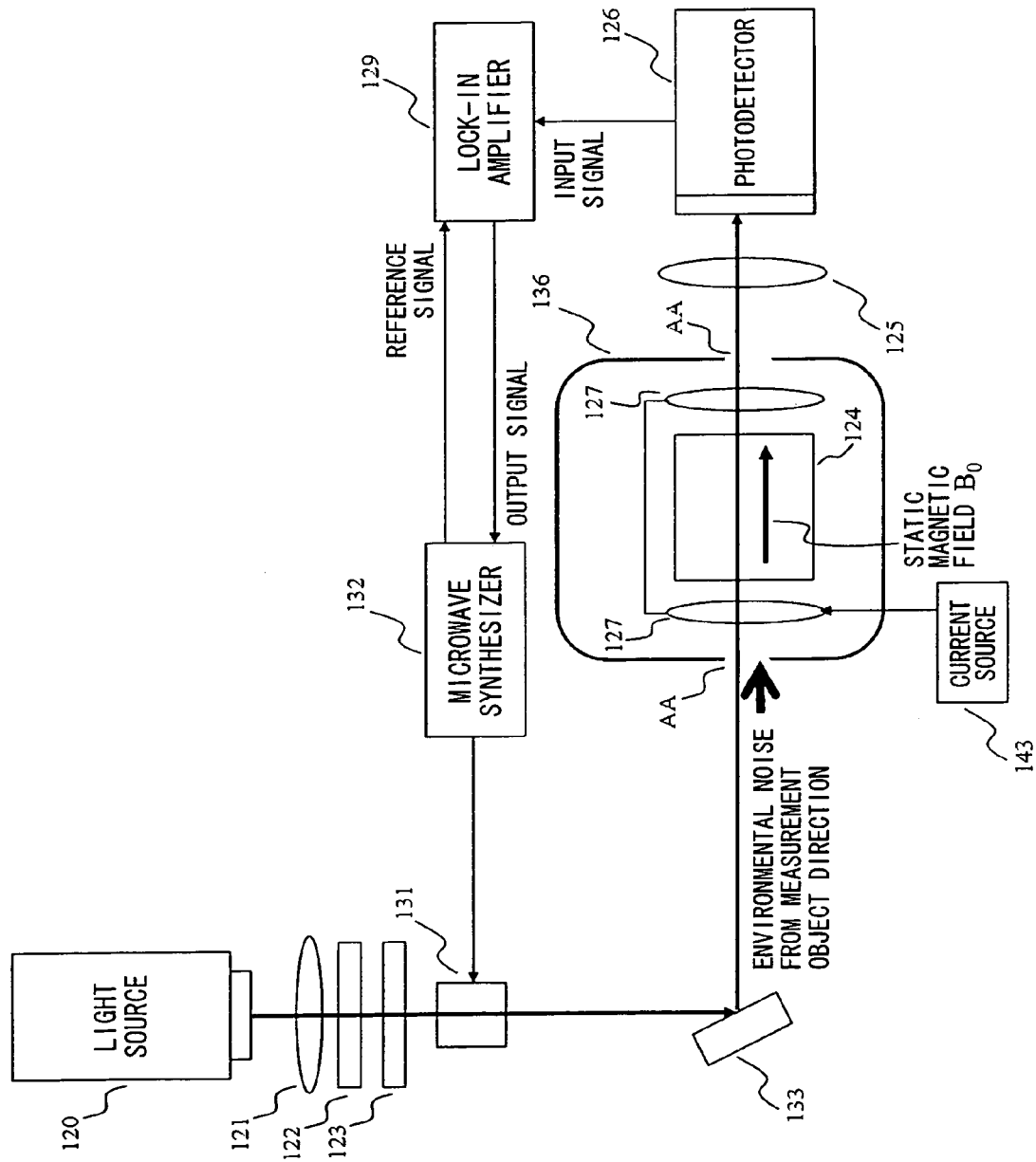
FIG. 18 is a diagram showing a configuration example of a CPT resonance type optical pumping magnetometer provided with the magnetic shield case.
Figure 19:
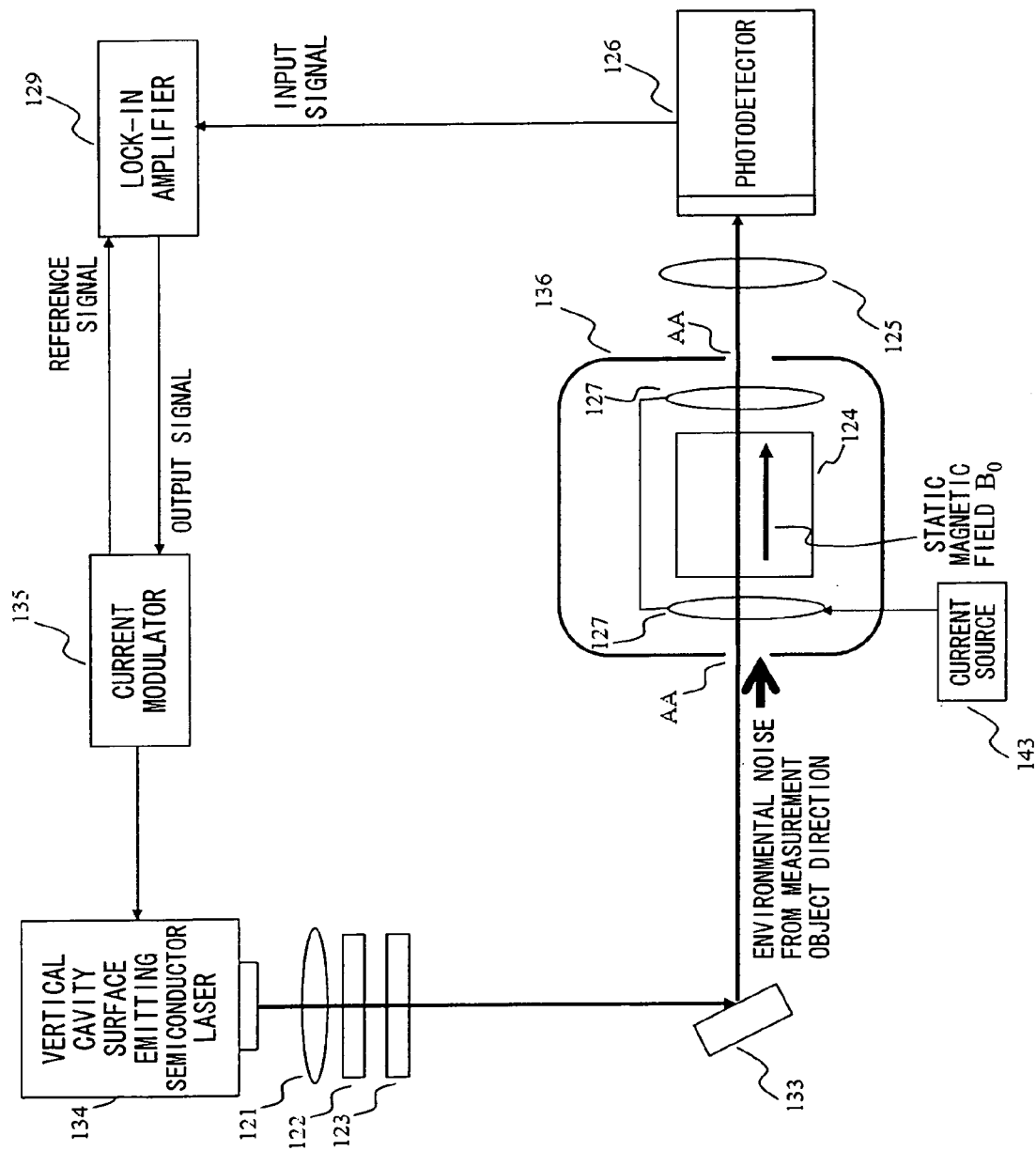
FIG. 19 is a diagram showing another configuration example of the CPT resonance type optical pumping magnetometer provided with the magnetic shield case.

Note that, as shown in FIG. 18 and FIG. 19, it is also possible to suppress the influence of the environmental magnetic noise by use of the magnetic shield case 136 similarly in the case of the CPT resonance type optical pumping magnetometer, the noise causing a turbulence of the static magnetic field $B_0$. Moreover, as shown in FIG. 15, a similar effect of using the magnetic shield case 136 is obtained in a case where the vectorial sum of the static magnetic fields from the respective static magnetic field applying coils 127 is used as the magnetic field to be applied to the vapor cell 124.

Figure 16:
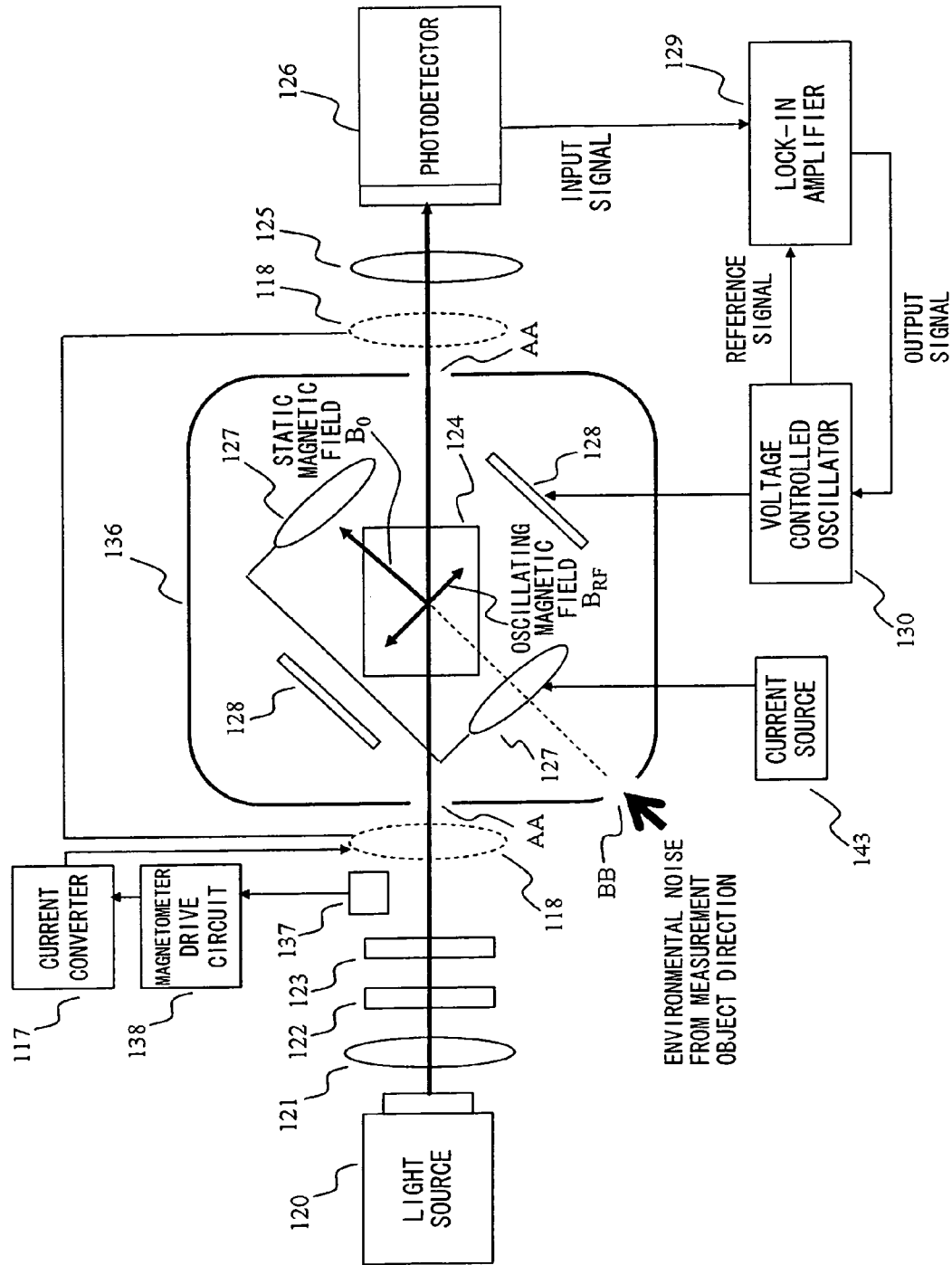
FIG. 16 is a diagram showing still another configuration example of the optical-microwave resonance type optical pumping magnetometer provided with the magnetic shield case.
Figure 17:
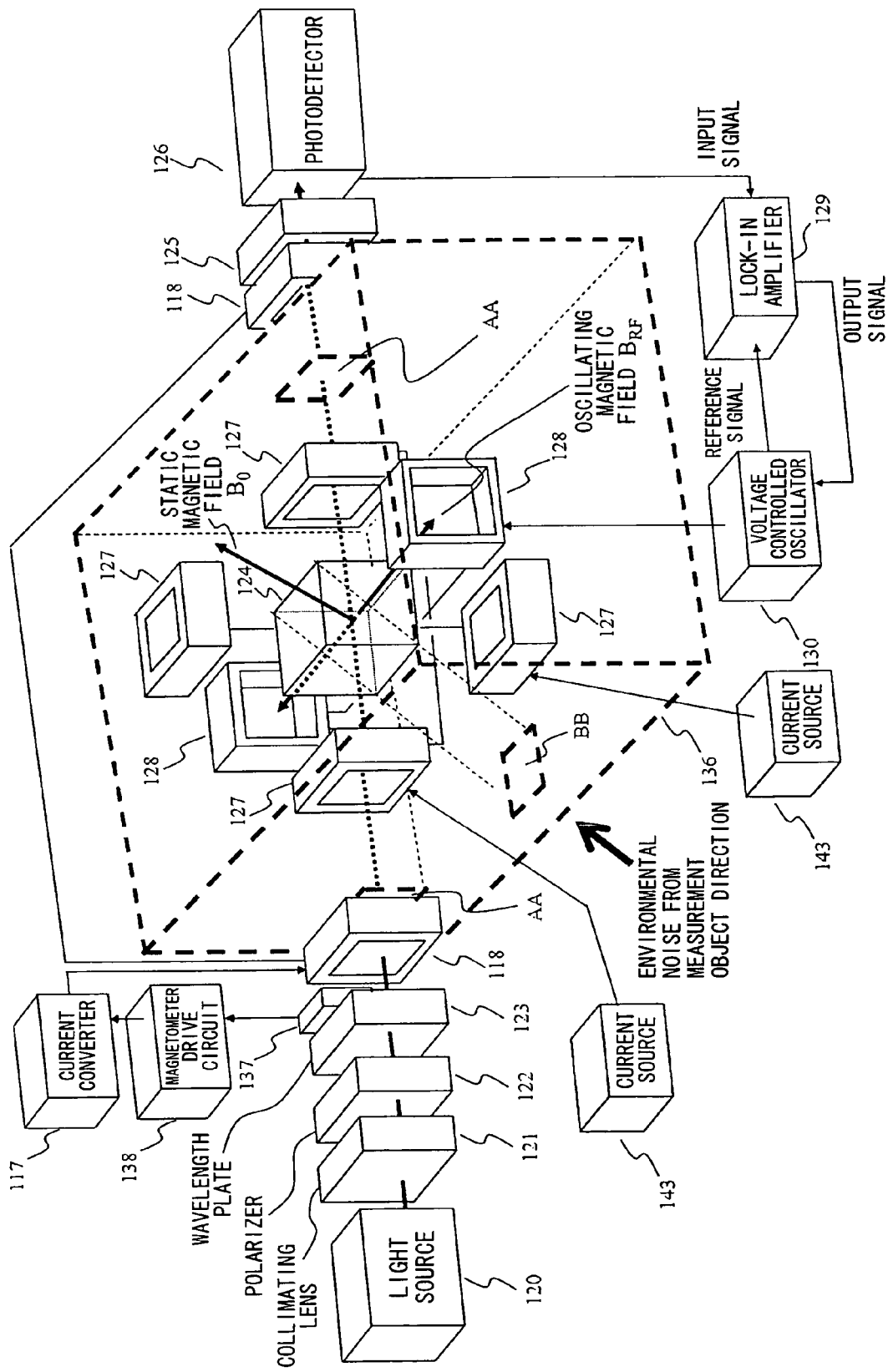
FIG. 17 is a diagram showing still another configuration example of the optical-microwave resonance type optical pumping magnetometer provided with the magnetic shield case.

In addition, as shown in FIG. 16 and FIG. 17, a magnetometer 137 (for example, a fluxgate magnetometer or the like) is disposed adjacently to one of holes AA provided in the magnetic shield case 136 in an optical axis direction of the beam from the light source 120, and environmental magnetic noise entering the magnetic shield case 136 from the holes AA is detected with the magnetometer 137. The environmental magnetic noise detected with the magnetometer 137 is transmitted to the current converter 117 through a magnetometer drive circuit 138 and converted into an amount of a current, and the amount of the current is inputted to the magnetic field generating coils 118 disposed between one of the holes AA and the magnetometer 137. The magnetic field generating coils 118 cancel the environmental magnetic noise by generating magnetic field in a phase opposite to the magnetic noise entering the magnetic shield case 136 from the holes AA. In this way, it is possible to further improve the favorable effect as compared to the cases of using only the magnetic shield case 136 as shown in FIG. 14 and FIG. 15.

Figure 20:
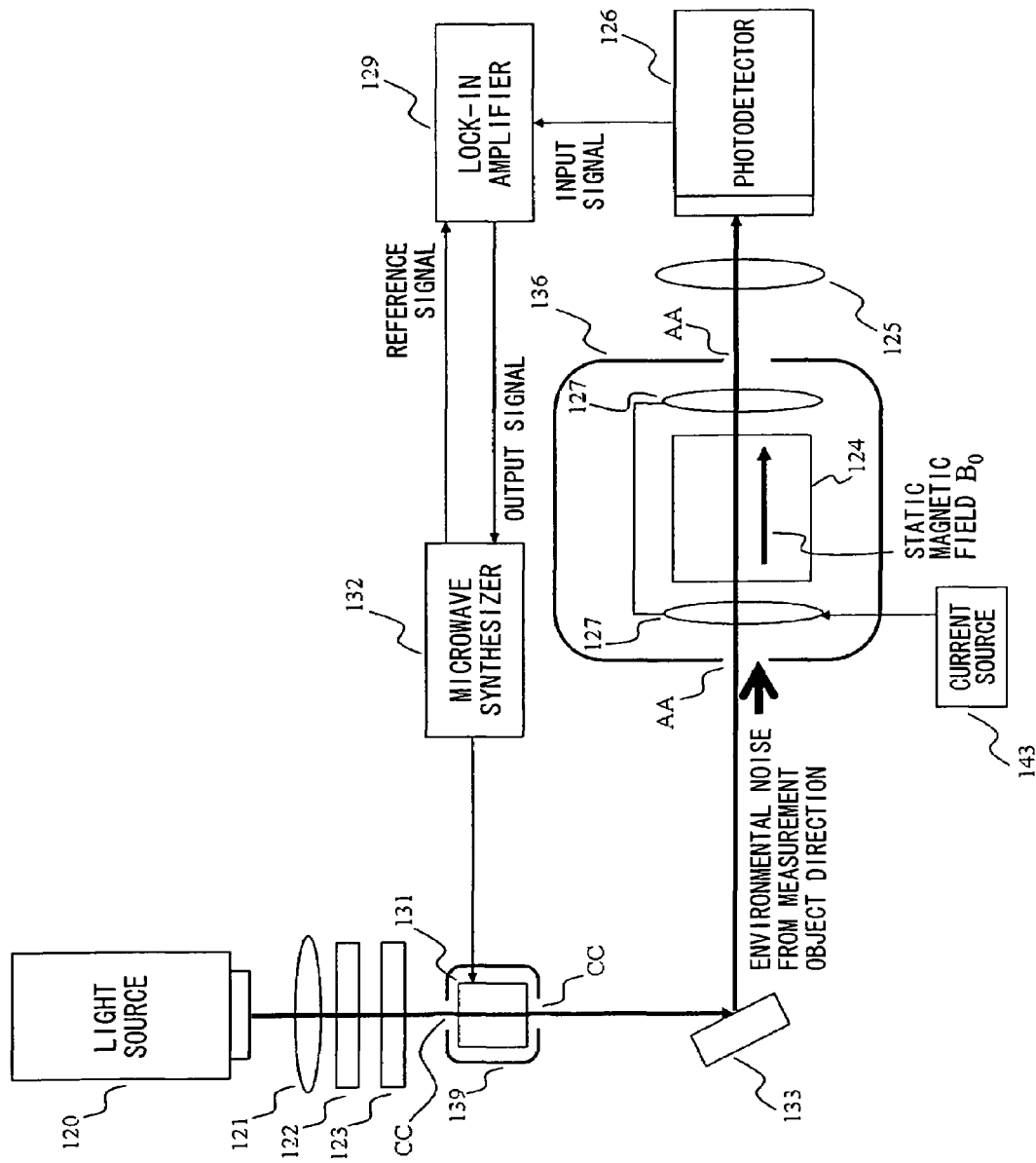
FIG. 20 is a diagram showing still another configuration example of the CPT resonance type optical pumping magnetometer provided with the magnetic shield case.

Furthermore, by housing the electro-optic modulator 131 in an electromagnetic shield case 139 made of metal having high conductivity (such as copper or aluminum) as shown in FIG. 20, it is possible to suppress high-frequency magnetic noise coming out of the electromagnetic shield case 139. Note that the size of the magnetic shield case 136 depends on the sizes of the vapor cell 124, the static magnetic field applying coils 127 and the RF coils 128 in the case of the optical-microwave resonance type optical pumping magnetometer, and depends on the sizes of the vapor cell 124 and the static magnetic field applying coils 127 in the case of the CPT resonance type optical pumping magnetometer. Moreover, the sizes of the holes AA and BB provided in the magnetic shield case 136 suffice to be as large as the size of the vapor cell 124, and the sizes of holes CC provided on the electromagnetic shield case 139 suffice to be as large as an entrance window of the electro-optical modulator 131. Note that, if two pairs of the static magnetic field coils 127 are used herein, such a configuration brings about an advantage that it is possible to perform the fine tuning when setting the optimal angle of 45 degrees formed by the static magnetic field $B_0$ and the light source 120.

Figure 21:
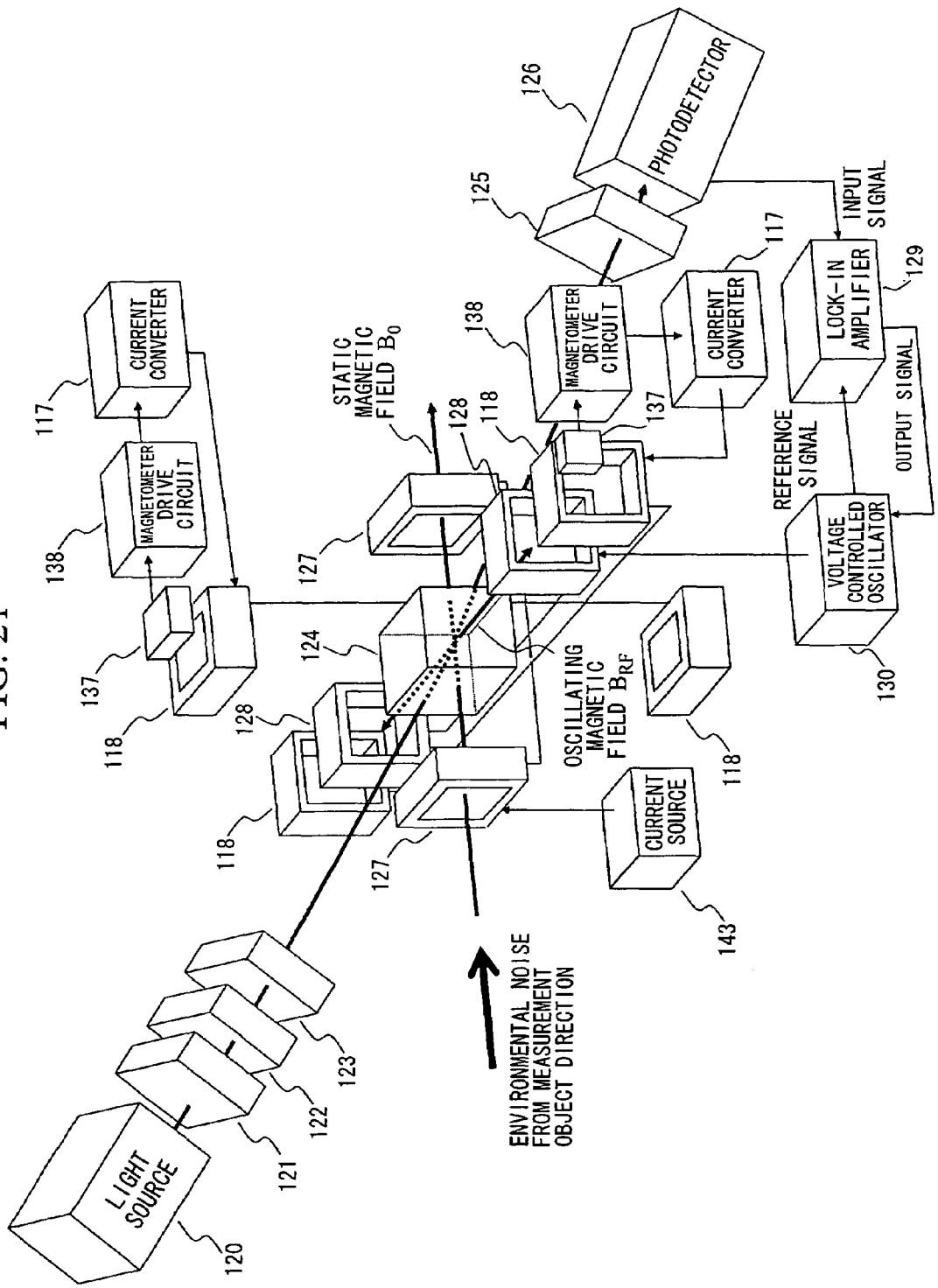
FIG. 21 is a diagram showing a configuration example of an optical-microwave resonance type optical pumping magnetometer provided with an environmental magnetic noise canceller.
Figure 22:
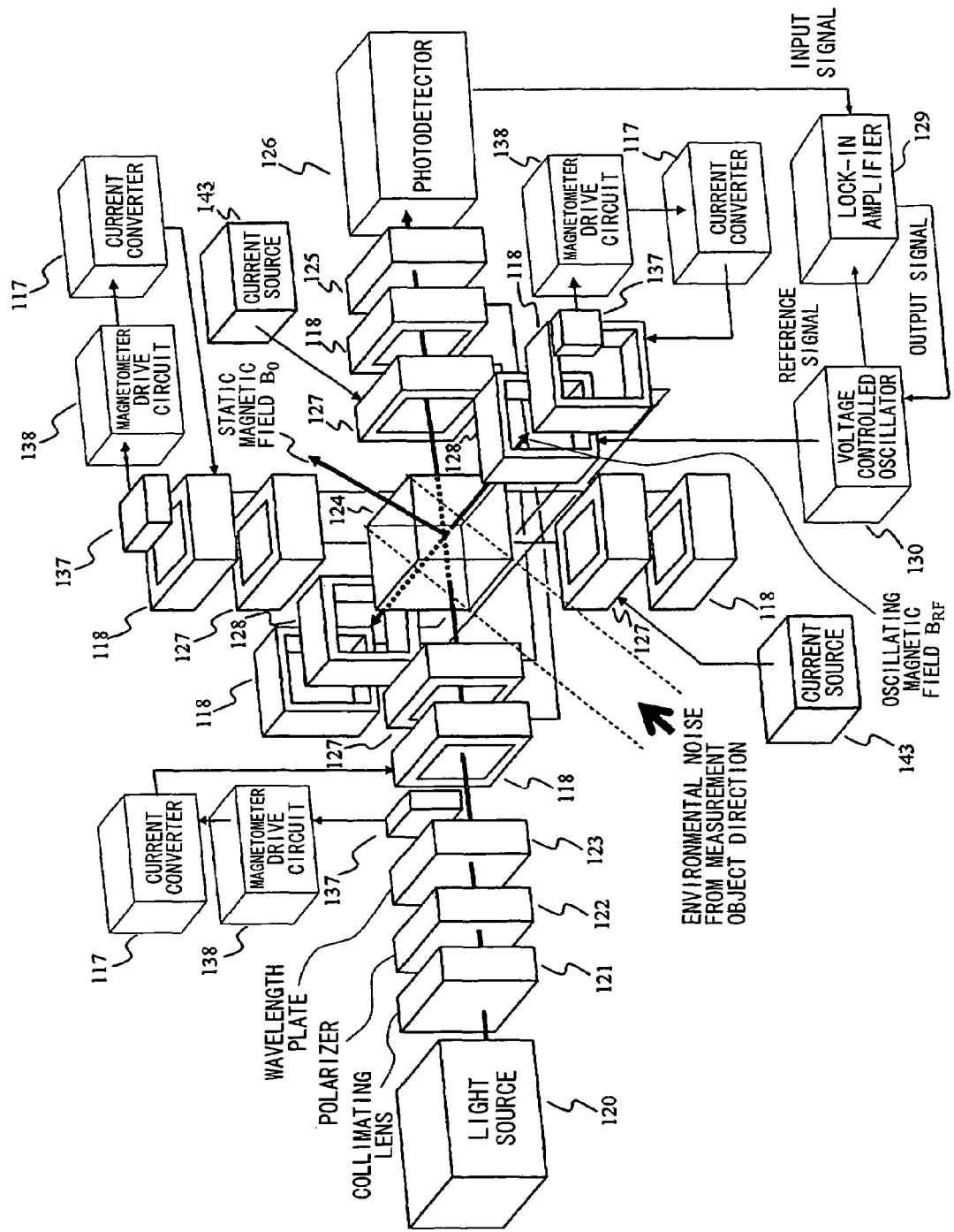
FIG. 22 is a diagram showing another configuration example of the optical-microwave resonance type optical pumping magnetometer provided with the environmental magnetic noise canceller.
Figure 23:
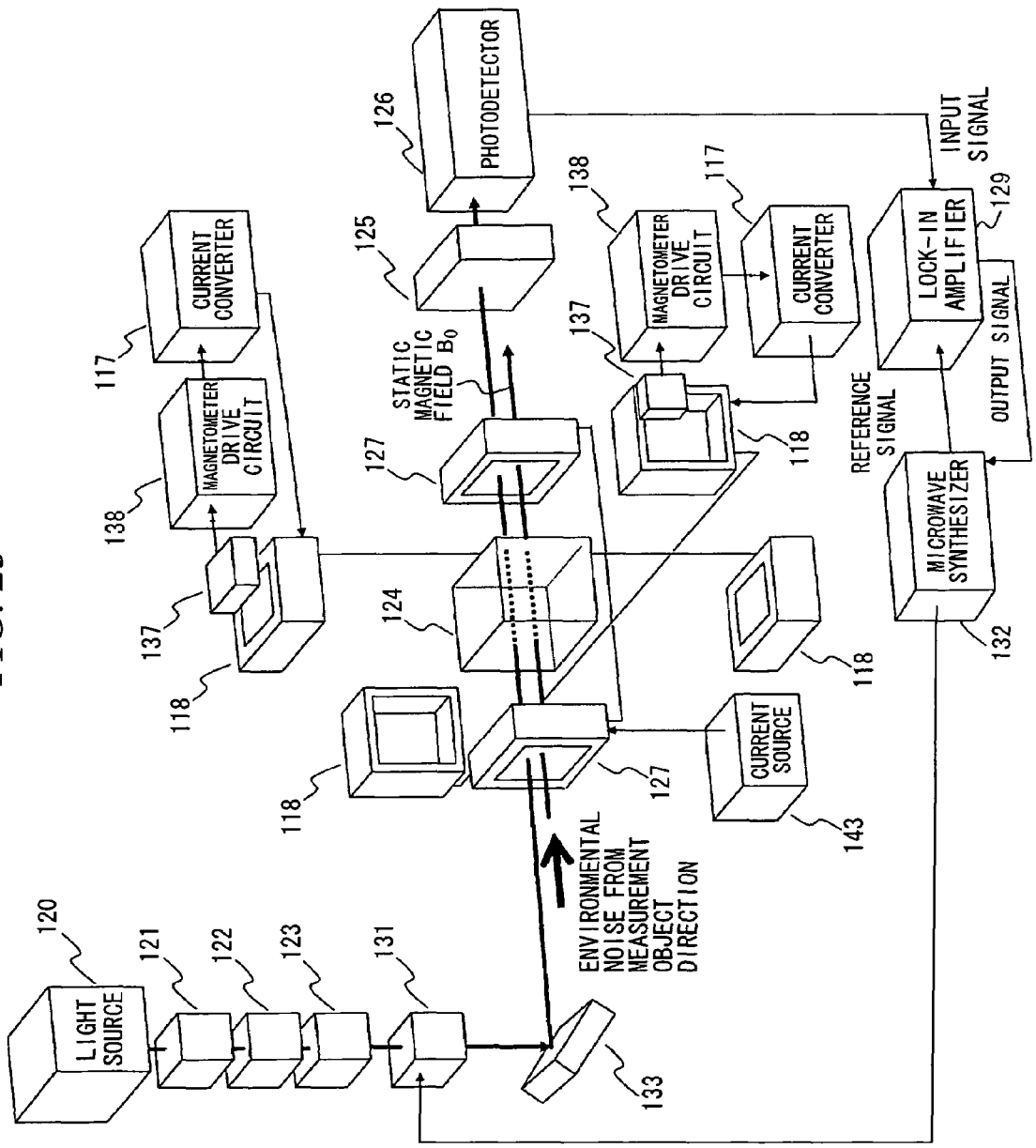
FIG. 23 is a diagram showing a configuration example of a CPT resonance type optical pumping magnetometer provided with an environmental magnetic noise canceller.
Figure 24:
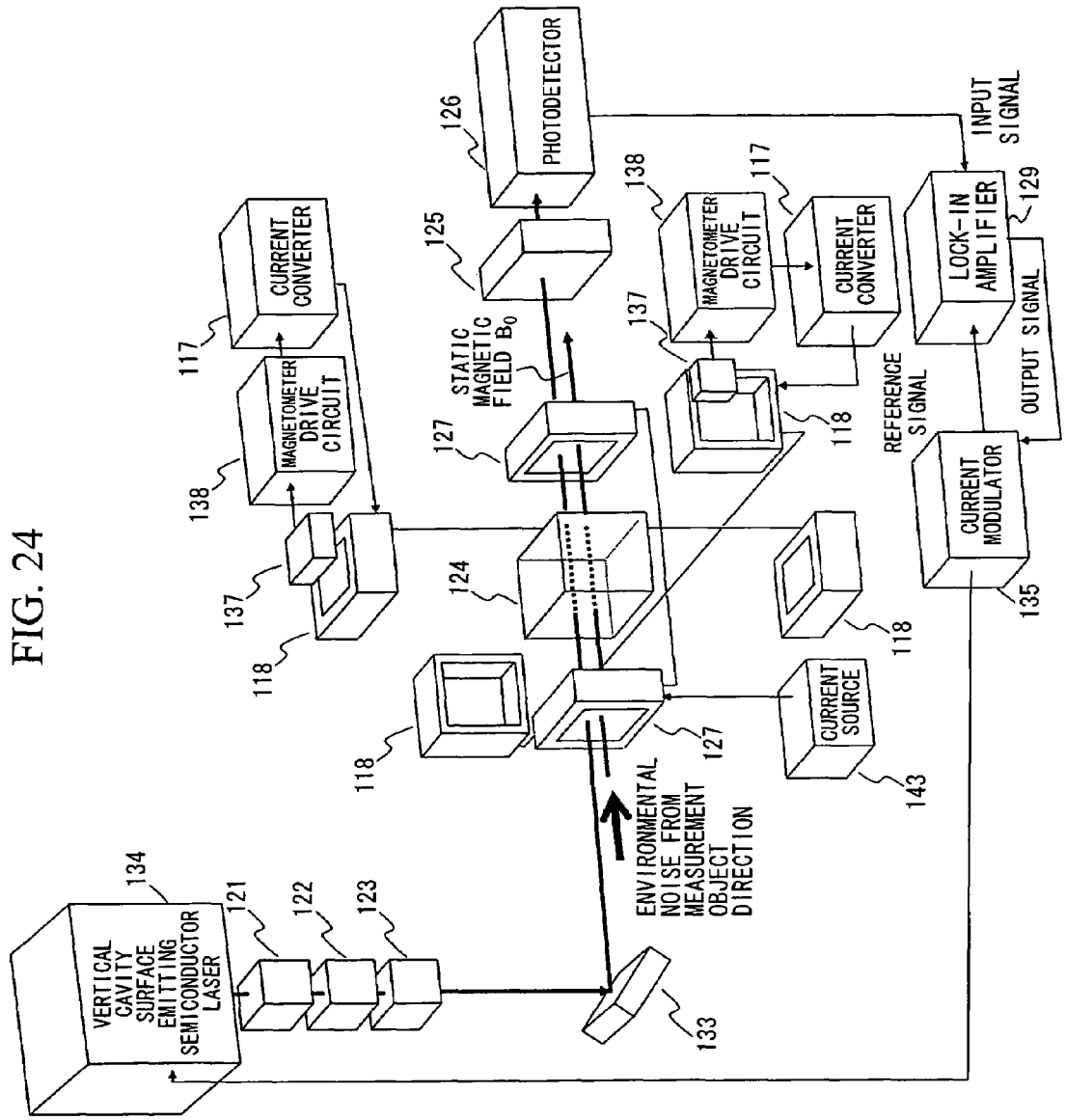
FIG. 24 is a diagram showing another configuration example of the CPT resonance type optical pumping magnetometer provided with the environmental magnetic noise canceller.
Figure 25:
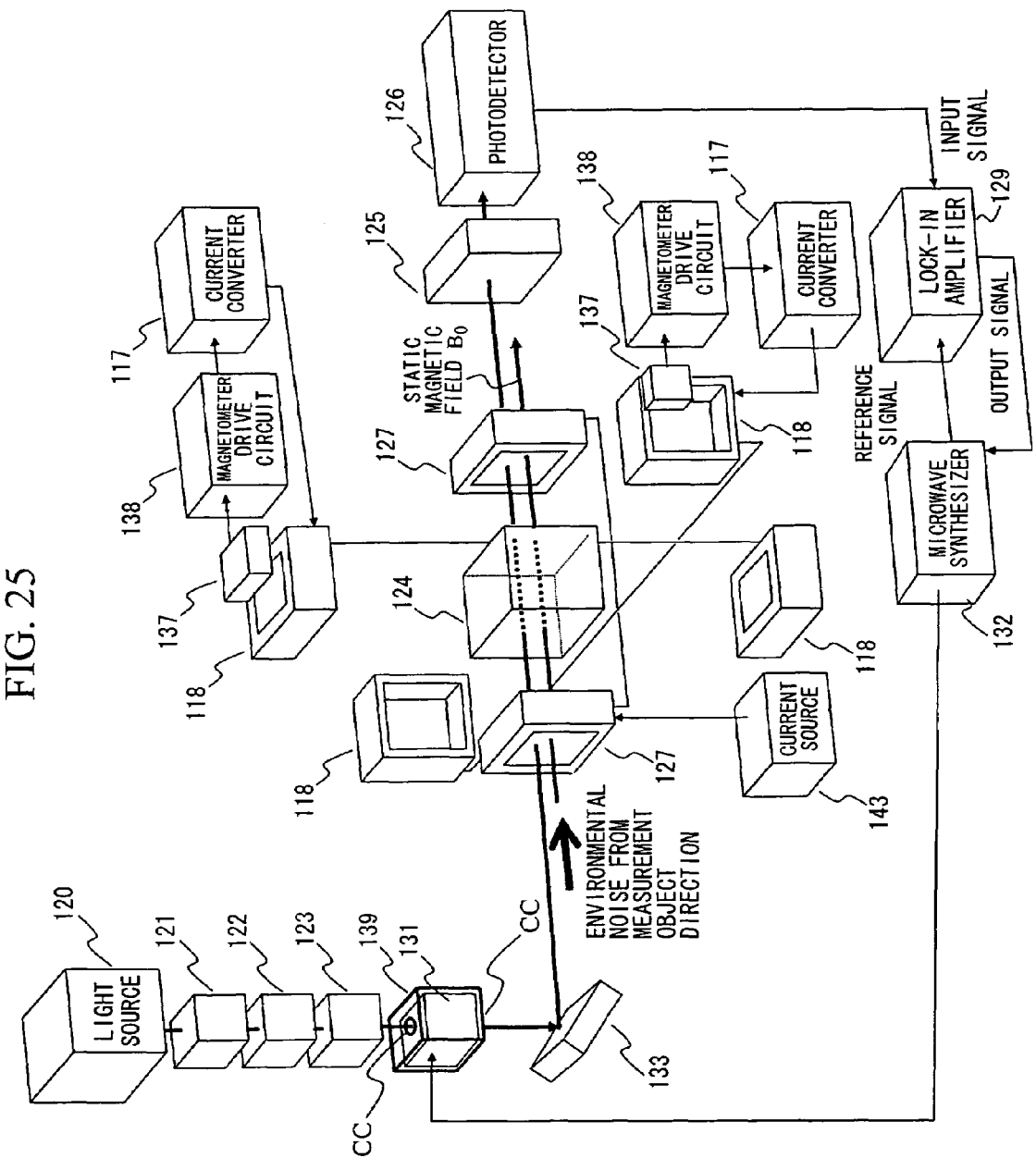
FIG. 25 is a diagram showing still another configuration example of the CPT resonance type optical pumping magnetometer provided with the environmental magnetic noise canceller.

FIG. 21 is a diagram showing a configuration example of an optical-microwave resonance type optical pumping magnetometer in the case of the present invention. The magnetometers 137 for detecting the environmental magnetic noise entering in the two directions orthogonal to the direction of static magnetic field application are disposed adjacently to the vapor cell 124. The environmental magnetic noise detected with the magnetometers 137 is transmitted to the current converters 117 through the magnetometer drive circuits 138. The environmental magnetic noise is converted into an amount of current by use of the current converters 117 and is inputted to the magnetic field generating coils 118 respectively disposed between the magnetometers 137 and the vapor cell 124. In this way, the magnetic fields in a phase opposite and in the same size with the environmental magnetic noise are generated by the magnetic field generating coils 118, thereby the environmental magnetic noise is cancelled. As shown in FIG. 23 or FIG. 24, it is also possible to apply a similar method for canceling the environmental magnetic noise in the case of the CPT resonance type optical pumping magnetometer. Moreover, as shown in FIG. 25, in the case of the CPT resonance type optical pumping magnetometer using the electro-optic modulator 131, it is more effective if the electro-optic modulator 131 is housed in the electromagnetic shield case 139. Furthermore, as shown in FIG. 22, the optical-microwave resonance type optical pumping magnetometer uses the two pairs of static magnetic field applying coils 127. In a case where the static magnetic field to be applied to the vapor cell 124 is defined as the vectorial sum of the static magnetic fields from the respective static magnetic field applying coils 127, the magnetometers 137 are respectively disposed adjacently to the vapor cell 124 in the optical axis direction of the beam from the light source and in the two directions orthogonal to the optical axis direction. The environmental magnetic noise in the respective directions detected with the magnetometers 137 is transmitted to the current converters 117 through the magnetometer drive circuits 138. The environmental magnetic noise in the respective directions is converted into amounts of current by the current converters 117, and is inputted to the magnetic field generating coils 118. Each of the environmental magnetic noise is cancelled by generating the magnetic fields in the same sizes as the environmental magnetic noise by use of the magnetic field generating coils 118. Note that, if two pairs of the static magnetic field coils 127 are used herein, such a configuration brings about an advantage that it is possible to easily adjust the angle formed by the light source 120 and the static magnetic field $B_0$.

Figure 26:
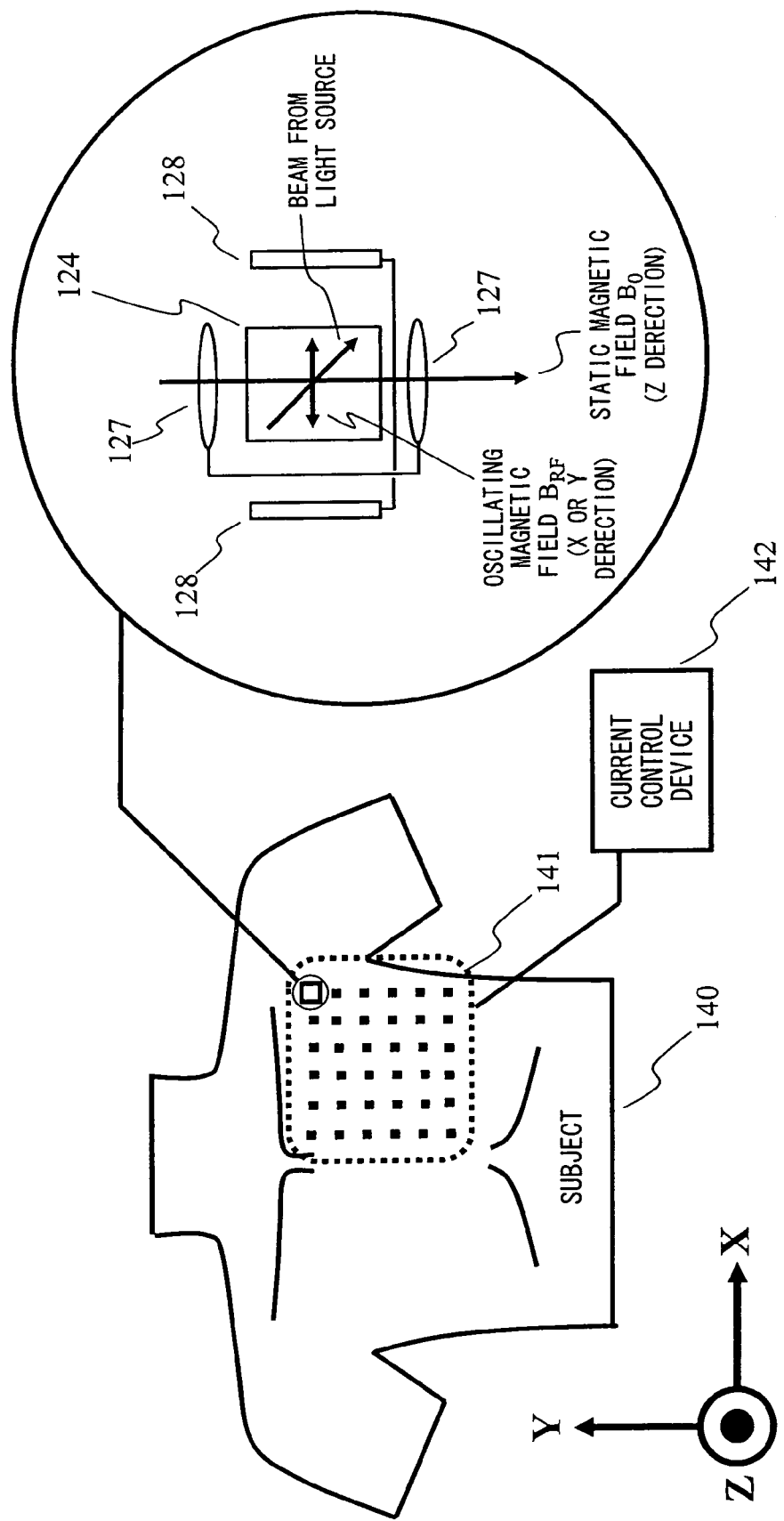
FIG. 26 is a diagram showing a configuration example of a multichannel optical-microwave resonance type optical pumping magnetometer.
Figure 32:
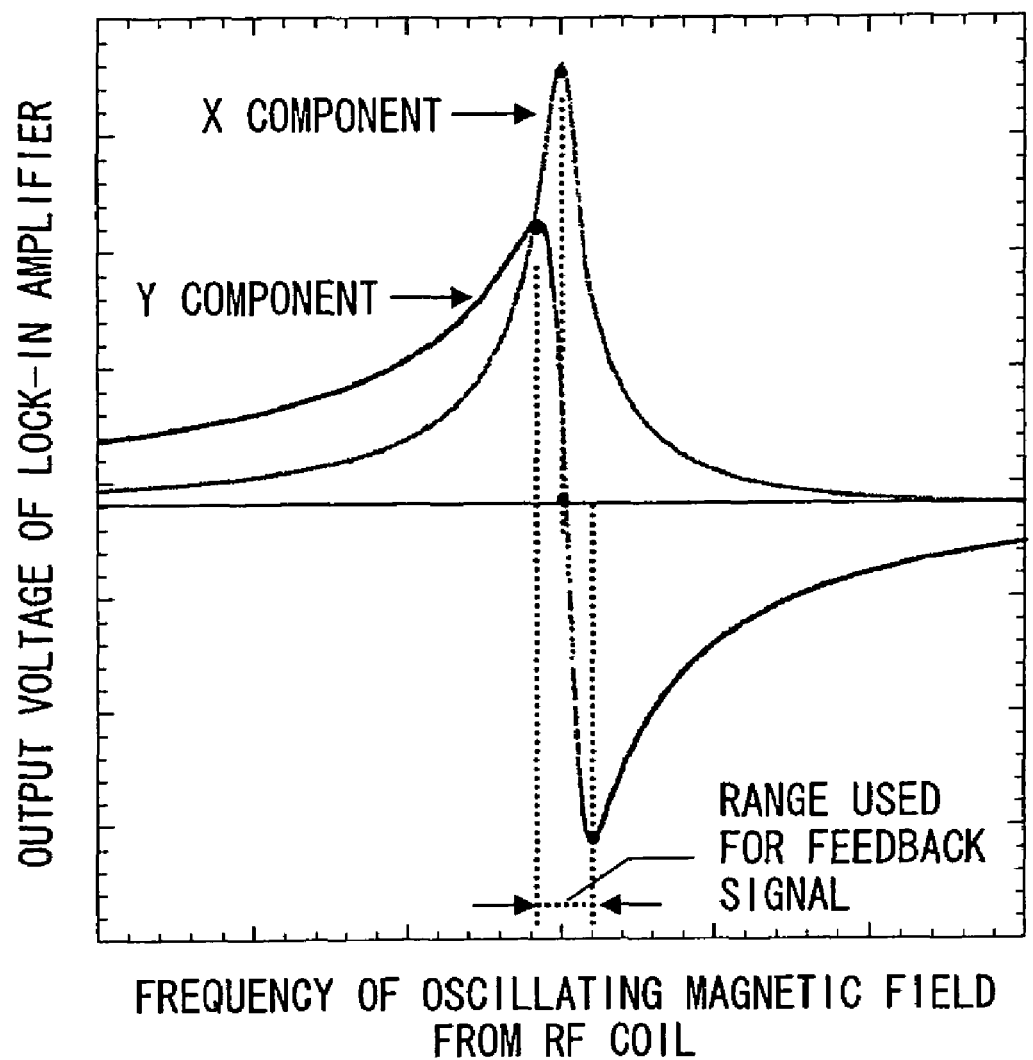
FIG. 32 is a graph showing a range used for output signals of a lock-in amplifier by use of resonance curves of an optical-microwave resonance type optical pumping magnetometer.

FIG. 26 is a diagram showing a configuration example of a multichannel optical-microwave resonance type optical pumping magnetometer in the case of the present invention. Each of channels is an assembly including the vapor cell 124, the pair of static magnetic field applying coils 127 and the pair of RF coils 128. These channels are arranged in a lattice immediately above the chest (the cardiac region) of a subject 140. The static magnetic field is applied to the individual vapor cell 124 in a direction (Z direction) perpendicular to the chest of the subject 140 by use of the individual pair of static magnetic field applying coils 127. Moreover, the oscillating magnetic field is applied to the individual vapor cell 124 in a direction (X or Y direction) orthogonal to the direction of static magnetic field application by use of the individual pair of RF coils 128. When the static magnetic field is applied to the vapor cell 124, the atoms inside the vapor cell 124 are precessing proportionately with the intensity of the static magnetic field. Here, when a frequency of the oscillating magnetic field applied to the vapor cell 124 coincides with a precession frequency of the atoms, resonance is generated and an intensity of a transmitted light passing through the vapor cell 124 is thereby increased. Accordingly, by sweeping the frequency of the oscillating magnetic field, it is possible to obtain a resonance curve (in which a longitudinal axis of a graph indicates an output value (X component) of the lock-in amplifier 129, and a lateral axis of the graph indicates the frequency of the oscillating magnetic field (or the static magnetic field intensity)) having a peak at a resonance frequency. A waveform obtained by calculating first derivation of this resonance curve becomes an output (Y component) of the lock-in amplifier 129. An output voltage of the lock-in amplifier 129 adjusted in a range of the highest value to the lowest value of this Y component at the maximum is used as a signal to be fed back to the voltage controlled oscillator 130 (FIG. 32).

Figure 33:
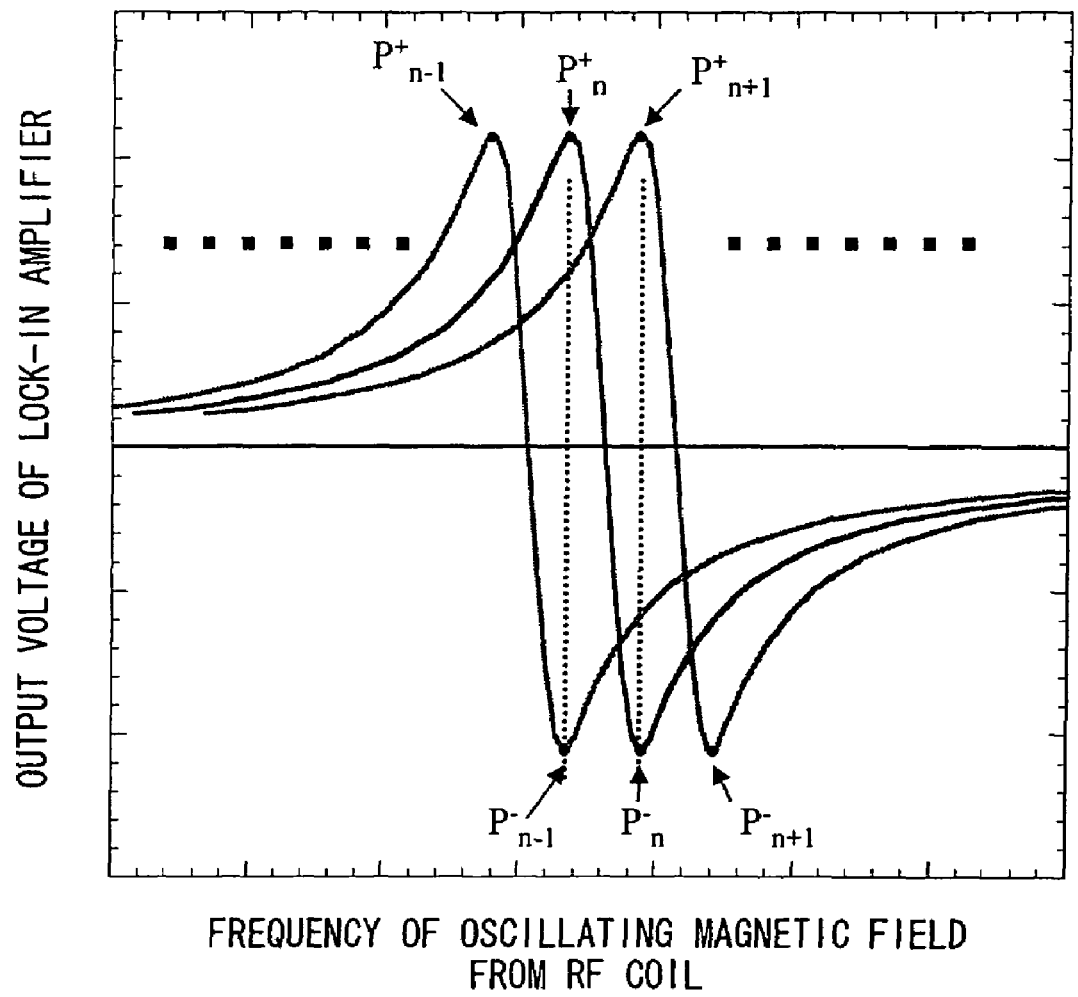
FIG. 33 is a graph showing setting conditions of resonance curves in the multichannel optical-microwave resonance type optical pumping magnetometer.

Taking the above into consideration, the static magnetic field intensities to be applied to the respective vapor cells 124 are adjusted to be different from one another by use of a current control device 142. In this case, an oscillating magnetic field frequency constituting a maximum value ($P^+_n$) of the output signal (the Y component) of the lock-in amplifier 129 in each of the vapor cells 124 is set equal to or above an oscillating magnetic field frequency constituting a minimum value ($P^-_{n-1}$) of an adjacent Y component, while an oscillating magnetic field frequency constituting a minimum value ($P^-_n$) of the Y component is set equal to or below an oscillating magnetic field frequency constituting a maximum value ($P^+_{n+1}$) of an adjacent Y component. In this way, it is possible to avoid an adverse effect to operation of the magentometers attributable to the interference of the oscillating magnetic fields between the mutually adjacent vapor cells 124 (FIG. 33).

Figure 27:
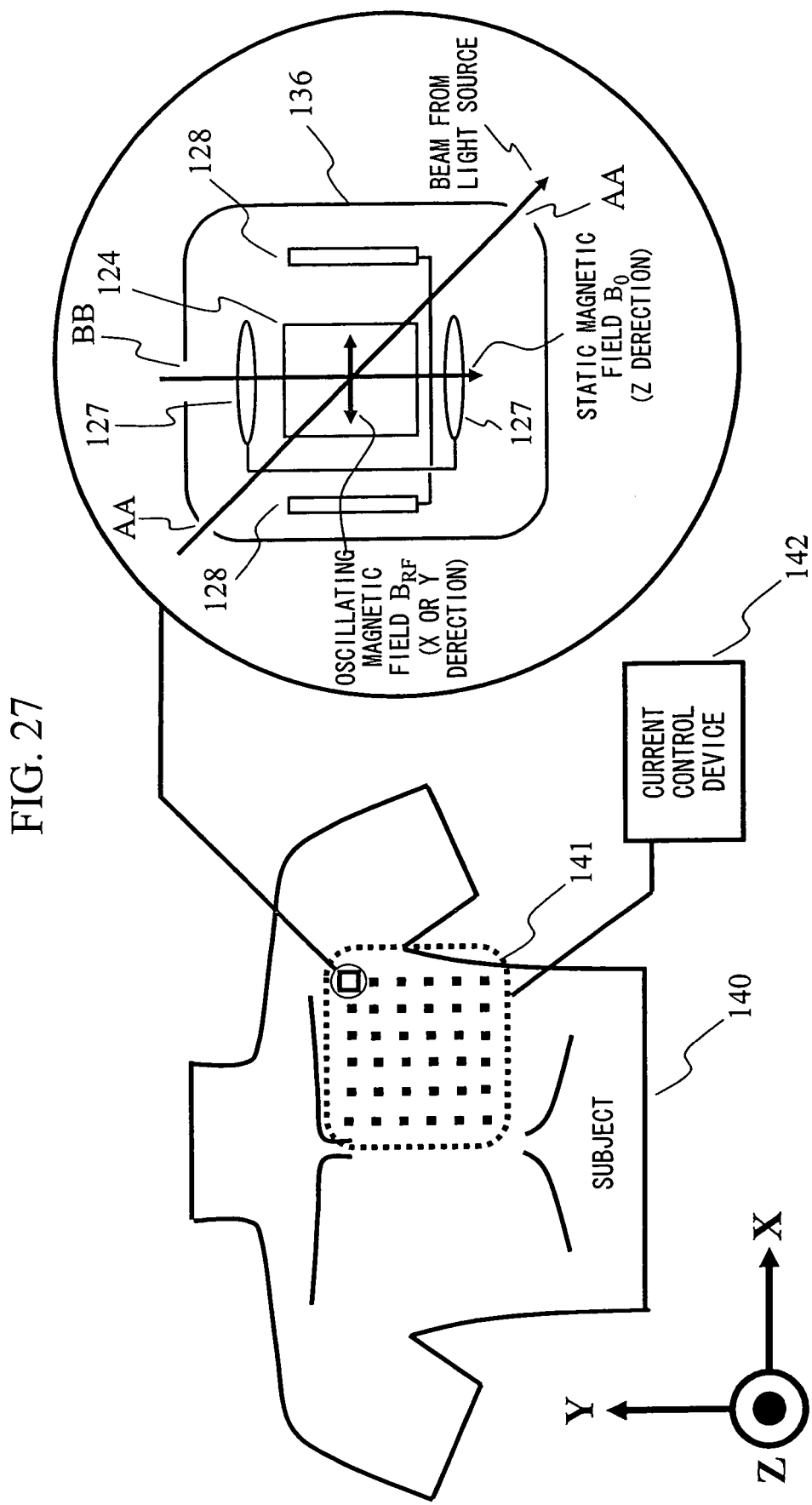
FIG. 27 is a diagram showing another configuration example of the multichannel optical-microwave resonance type optical pumping magnetometer.
Figure 28:
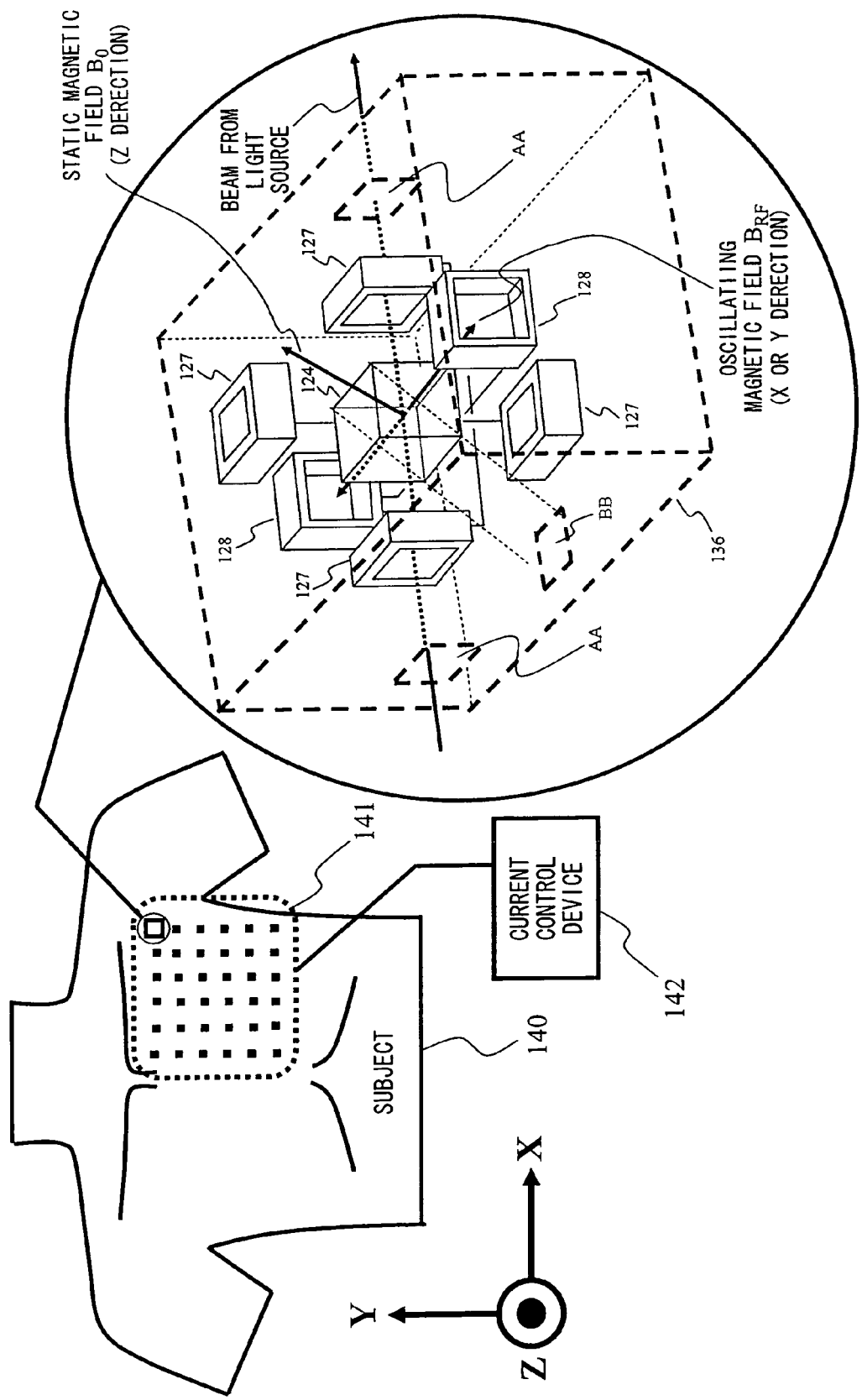
FIG. 28 is a diagram showing still another configuration example of the multichannel optical-microwave resonance type optical pumping magnetometer.
Figure 29:
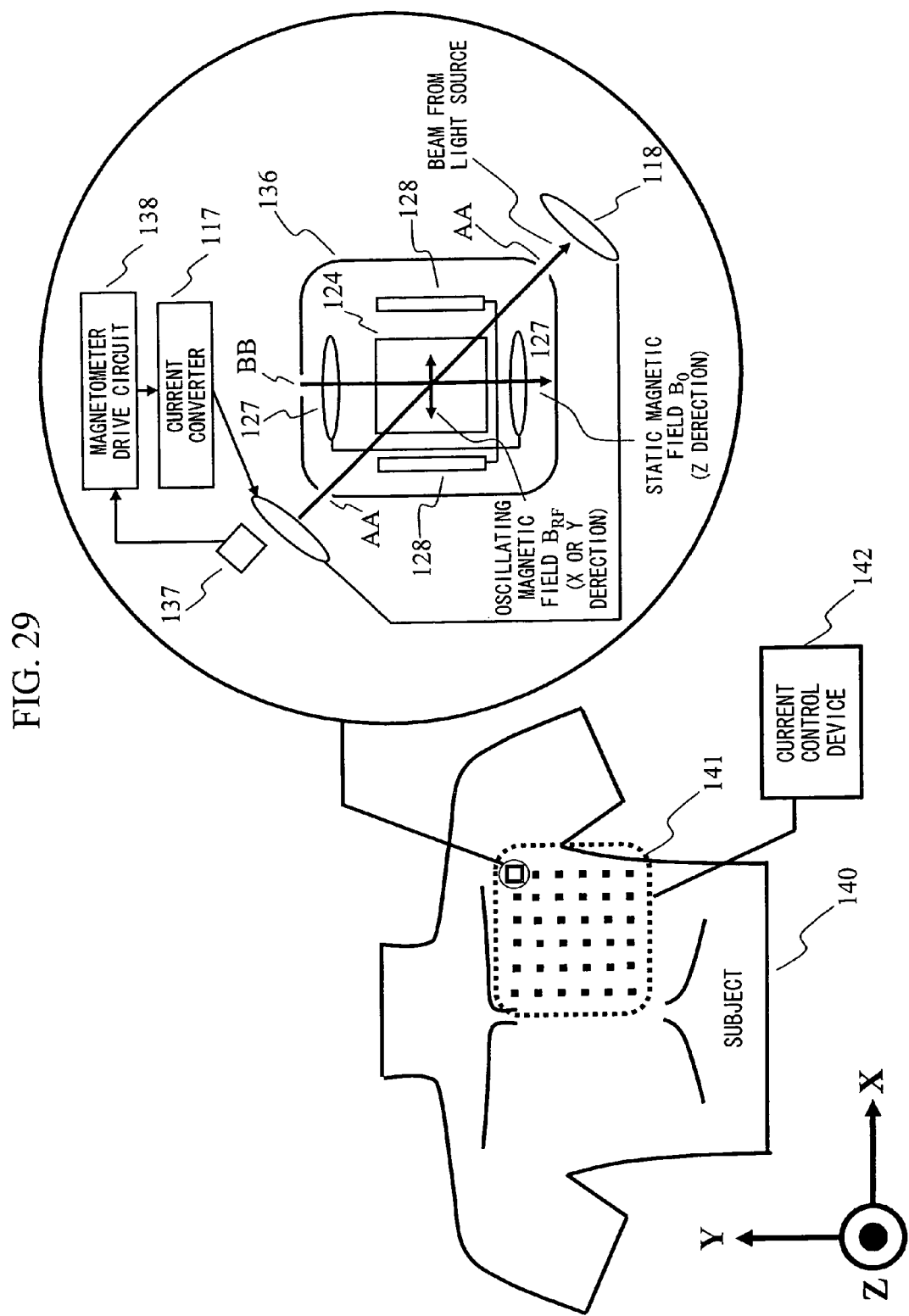
FIG. 29 is a diagram showing still another configuration example of the multichannel optical-microwave resonance type optical pumping magnetometer.
Figure 30:
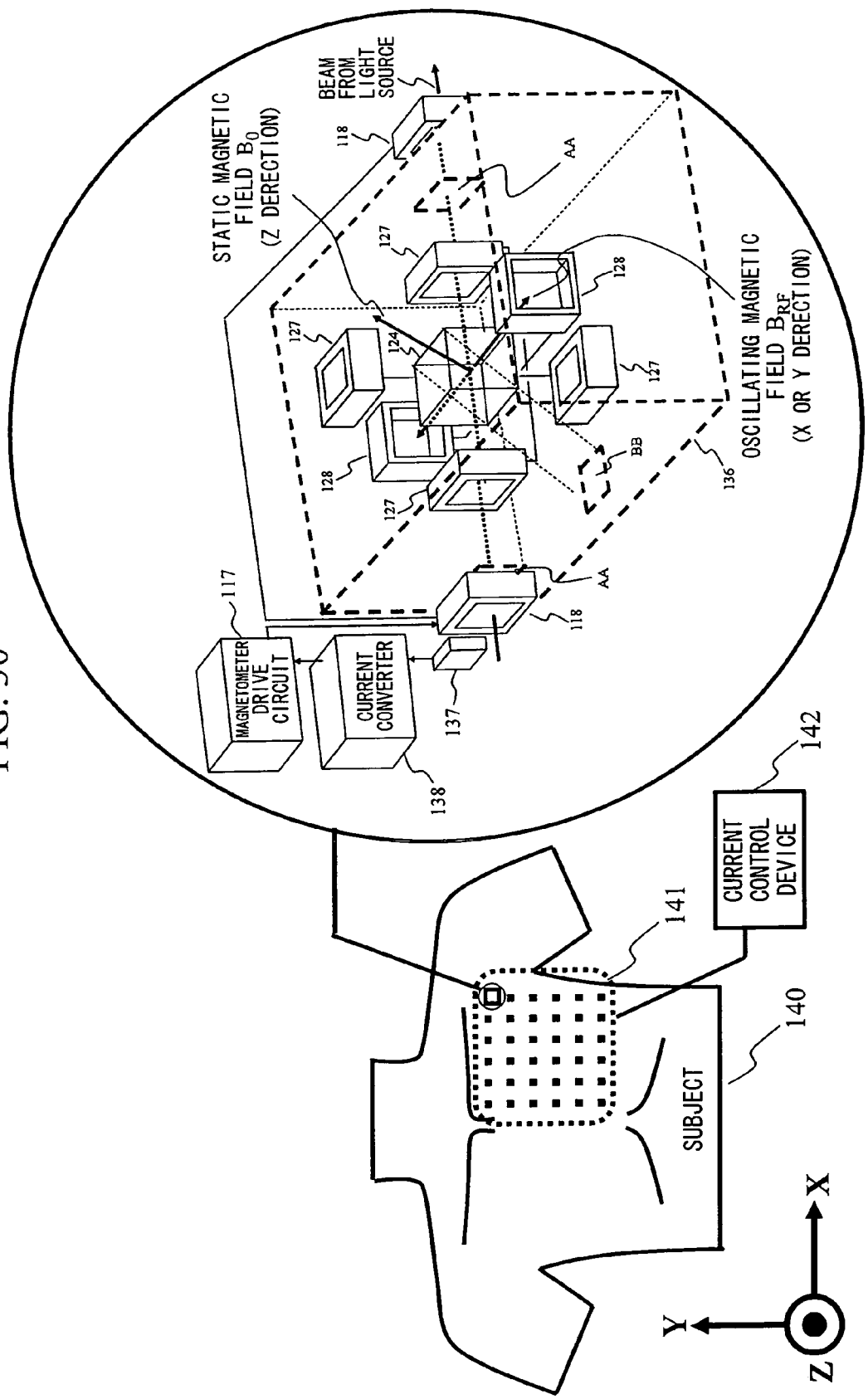
FIG. 30 is a diagram showing still another configuration example of the multichannel optical-microwave resonance type optical pumping magnetometer.
Figure 31:
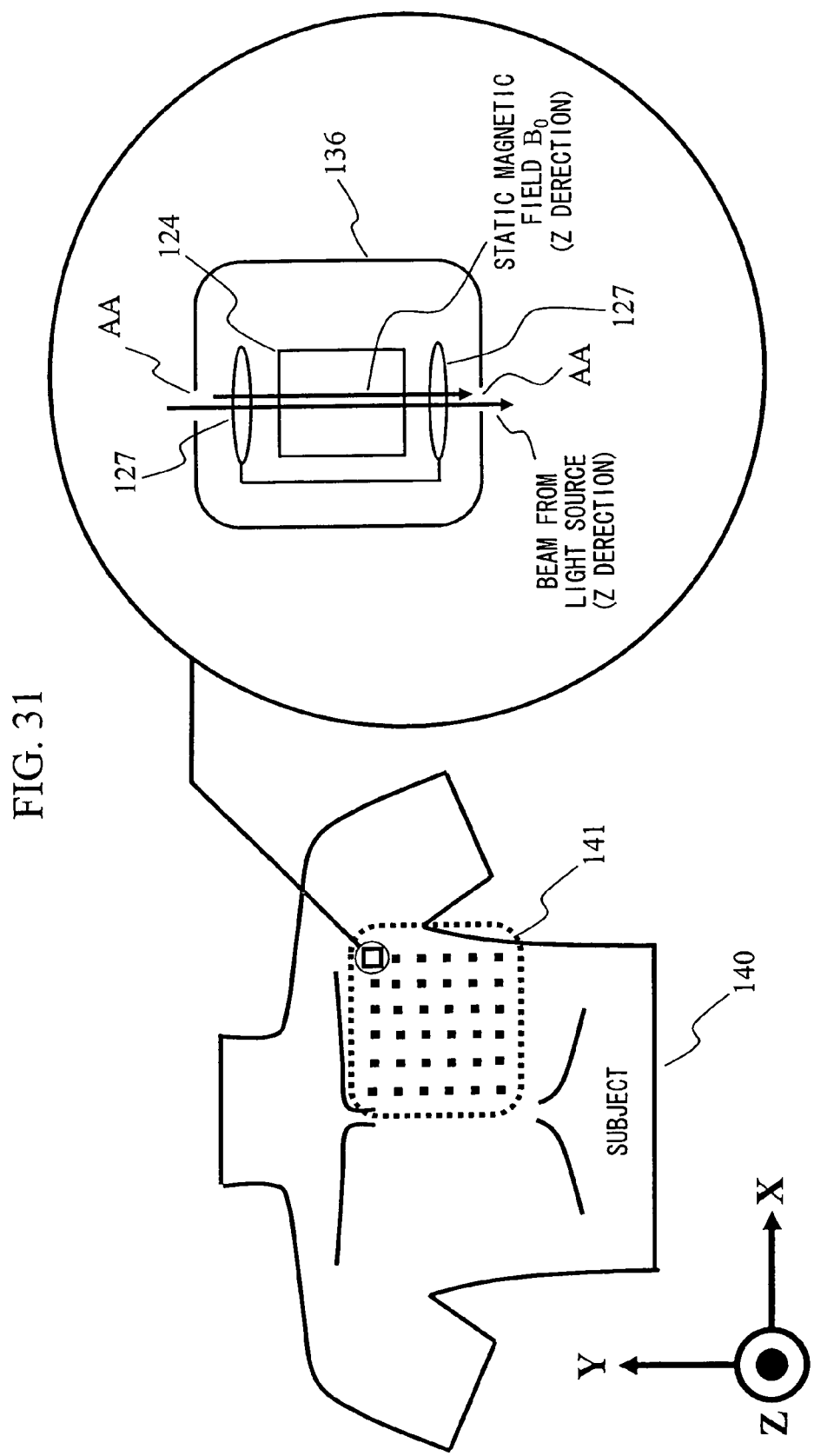
FIG. 31 is a diagram a configuration example of a multi-channel CPT resonance type optical pumping magnetometer.

Moreover, if the vapor cell 124, the static magnetic field applying coils 127 and the RF coils 128 are housed in the magnetic shield case 136 as shown in FIG. 27 and FIG. 0.28, it is also possible to suppress an influence of the environmental magnetic noise entering the vapor cell 124 and is therefore more effective. In this case, as shown in FIG. 29 and FIG. 30, the magnetometer 137 such as a fluxgate magnetometer is disposed in front of one of the holes AA formed in the magnetic shield case 136 for allowing passage of the light from light source, thereby detecting environmental magnetic noise entering from the holes AA. The environmental magnetic noise detected with the fluxgate magnetometer is converted into an amount of a current by use of the current converter 117, and are transmitted to the magnetic field generating coil 118 disposed between one of the holes AA and the fluxgate magnetometer. The environmental magnetic noise is cancelled by generating a magnetic field in a phase opposite to the environmental magnetic noise entering from the holes AA. Moreover, as shown in FIG. 31, it is also possible to use a multichannel CPT resonance type optical pumping magnetometer in a similar way by housing the components in the magnetic shield case 136. Here, in the case of using the electro-optic modulator 131, it is more effective if the electro-optic modulator 131 is housed in the electromagnetic shield case 139.

Since the frequency band of the biomagnetic signal from the brains or the heart serving as the measurement object in the biomagnetic measurement ranges of 0.1 to 200 Hz, it is possible to avoid misidentification as the biomagnetic signal if the frequency band of the oscillating magnetic field $B_{RF}$ is set in a range grater than 200 Hz. That is, the frequency band ($\omega$) of the oscillating magnetic field $B_{RF}$ used in the multichannel optical-microwave resonance type optical pumping magnetometer is preferably set in the range of $\omega > 200$ Hz.

The frequency of the oscillating magnetic field $B_{RF}$ used in the multichannel optical-microwave resonance type optical pumping magnetometer is determined by the static magnetic field intensity to be applied to the vapor cell 124 and by the type of the alkali metal inside the vapor cell 124. The alkali metal to be filled in the vapor cell 124 mainly includes cesium ($^{133}$Cs), rubidium ($^{85}$Rb or $^{87}$Rb), potassium ($^{39}$K or $^{41}$K) of the like. In the optical pumping magnetometer 116 of the present invention, the static magnetic field intensity to be applied to the vapor cell 124 is preferably set greater than some 57.14 nT when using $^{133}$Cs as the alkali metal in the vapor cell, greater than some 42.85 nT when using $^{85}$Rb, greater than some 28.57 nT when using $^{87}$Rb, greater than some 28.57 nT when using $^{39}$K, or greater than some 28.57 nT when using $^{41}$K.

What is claimed is:

1. A magnetic field measuring system comprising:
   a biomagnetic measurement device including a detection coil and a superconducting quantum interference device (SQUID) magnetometer;
   an optical pumping magnetometer configured to measure environmental magnetic noise in the biomagnetic measurement device, the optical pumping magnetometer including:
   a light source;
   a vapor cell filled with an alkali metal gas;
   an optical system configured to convert beam from the light source into circularly polarized beam and to make the circularly polarized beam incident on the vapor cell;
   a photodetector configured to detect the beam passing through the vapor cell;
   Helmholtz coils configured to apply a static magnetic field to the vapor cell;
   means for applying an oscillating magnetic field in a direction orthogonal to the static magnetic field to the vapor cell, the means including a voltage controlled oscillator and radio-frequency (RF) coils; and
   a lock-in amplifier configured to perform lock-in detection of a phase between an output signal from the photodetector and a signal transmitted from the voltage controlled oscillator to the RF coils;
   magnetometers configured to measure environmental magnetic noise entering the vapor cell of the optical pumping magnetometer in directions except a direction of application of the static magnetic field;
   magnetometer drive circuits respectively connected to the magnetometers;
   current converters configured to respectively convert outputs from the magnetometer drive circuits into an amount of current; and
   output current from the current converter is inputted to magnetic field generating coils, the magnetic field generating coils being configured to apply a magnetic field to the vapor cell, the magnetic field being formed in an opposite phase to the environmental magnetic noise entering the vapor cell in the direction except the direction of application of the static magnetic field.

2. The magnetic field measurement system as recited in claim 1, wherein
   the magnetometers measure the environmental magnetic noise entering the vapor cell in two directions except the direction of application of the static magnetic field.

3. The magnetic field measurement system as recited in claim 1, wherein
   intensity of the static magnetic field applied to the vapor cell is in a range of about 57.14 nT to 285.71 µT when using cesium ($^{133}$Cs) as the alkali metal filled in the vapor cell, in a range of about 42.85 nT to 214.27 µT when using rubidium ($^{85}$Rb), in a range of about 28.57 nT to 142.85 µT when using rubidium ($^{87}$Rb), in a range of about 28.57 nT to 142.85 µT when using potassium ($^{39}$K), and in a range of about 28.57 nT to 142.85 µT when using potassium ($^{41}$K).

4. The magnetic field measurement system as recited in claim 1, wherein
   the optical pumping magnetometer includes a pair of the Helmholtz coils disposed in an optical axis direction of the beam from the light source, and a pair of the Helmholtz coils disposed in a direction orthogonal to the optical axis, both of the pairs interposing the vapor cell, and
   a static magnetic field applied from the two pairs of the Helmholtz coils to the vapor cell is at an angle of 45 degrees to the beam from the light source at the center of the vapor cell.

5. The magnetic field measurement system as recited in claim 1, further comprising:
   a tube having an axis parallel to the direction of the static magnetic field applied to the vapor cell, the tube being made of metal having high magnetic permeability, and being provided with a pair of holes in a side wall for allowing the beam from the light source to pass through, wherein
   the vapor cell, and Helmholtz coils and the RF coils are disposed inside the tube,
   the magnetometer is disposed so as to measure the environmental magnetic noise in a direction of a line joining the pair of holes, and
   the magnetic field generating coils for applying a magnetic field in an opposite phase to the environmental magnetic noise are disposed to interpose the pair of holes.

6. The magnetic field measurement system as recited in claim 1, further comprising:
   a tube having an axis parallel to an optical axis of the beam from the light source made incident on the vapor cell, the tube being made of metal having high magnetic permeability, and being provided with holes in a side wall, the holes being provided on an extension of the direction of the static magnetic field applied to the vapor cell, wherein
   the vapor cell, and Helmholtz coils and the RF coils are disposed inside the tube,
   the magnetometers are disposed so as to measure the environmental noise in an axial direction of the tube, and
   the magnetic field generating coils are disposed to apply a magnetic field in an opposite phase to the environmental magnetic noise in a direction of the axis of the tube.

7. The magnetic field measurement system as recited in claim 5, wherein
   the magnetometers for measuring environmental magnetic noise entering the tube in two directions orthogonal to the direction of application of the static magnetic field to the vapor cell, the magnetometer drive circuits, the current converters for converting the outputs from the magnetometer drive circuits into amounts of current, and the magnetic field generating coils for generating a magnetic field in an opposite phase to the environmental magnetic noise by use of the outputs of the current converters are provided around the tube.

8. The magnetic field measurement system as recited in claim 1, wherein
   the magnetic field in an opposite phase to the environmental magnetic noise entering the detection coil is generated by converting the environmental magnetic noise detected with the optical pumping magnetometer into an amount of current by use of the current converters and then transmitting the amount of the current to the magnetic field generating coil disposed between a measurement object and the detection coil.

9. The magnetic field measurement system as recited in claim 1, wherein
a voltage signal outputted from the optical pumping magnetometer and a voltage signal outputted from the SQUID magnetometer for detecting a biomagnetic signal containing the environmental magnetic noise are inputted to a subtraction circuit, and
the subtraction circuit is caused to output only the biomagnetic signal.

10. The magnetic field measurement system as recited in claim 1, wherein
the RF coils apply a rotational magnetic field having a magnetic field intensity half as large as the oscillating magnetic field instead of applying the oscillating magnetic field.

11. The magnetic field measurement system as recited in claim 1, wherein
any one of a rare gas and a nonmagnetic gas is filled as a buffer gas in the vapor cell.

12. The magnetic field measurement system as recited in claim 1, wherein
an inner wall of the vapor cell is coated with a nonmagnetic material.

13. A magnetic field measurement system comprising:
a biomagnetic measurement device including a superconducting quantum interference device (SQUID) magnetometer, a flux locked loop (FLL) circuit configured to drive the SQUID magnetometer, and an amplifier-filter circuit configured to process an output signal of the FLL circuit; and
an optical pumping magnetometer including a light source, a vapor cell filled with an alkali metal gas, an optical system configured to convert beam from the light source into circularly polarized beam and to make the circularly polarized beam incident on the vapor cell, a photodetector configured to detect the beam passing through the vapor cell, static magnetic field applying coils configured to apply a static magnetic field to the vapor cell, and a lock-in amplifier configured to process an output signal from the photodetector, wherein
environmental magnetic noise in the biomagnetic measurement device is detected by use of the optical pumping magnetometer.

14. The magnetic field measurement system as recited in claim 13, wherein
a magnetic field in an opposite phase to the environmental magnetic noise entering the SQUID magnetometer is generated by converting the environmental magnetic noise detected with the optical pumping magnetometer into an amount of current by use of a current converter and then transmitting the amount of the current converted with the current converter to the magnetic field generating coil disposed between a measurement object and the SQUID magnetometer.

15. The magnetic field measurement system as recited in claim 13, wherein
a voltage signal outputted from the optical pumping magnetometer and a voltage signal outputted from the FLL circuit through the SQUID magnetometer are inputted to a subtraction circuit, and
the subtraction circuit is caused to output a biomagnetic signal.

16. The magnetic field measurement system as recited in claim 13, wherein
the optical pumping magnetometer further includes a voltage controlled oscillator and radio-frequency (RF) coils which are driven by the voltage controlled oscillator, and which are configured to apply an oscillating magnetic field in a direction orthogonal to the static magnetic field to the vapor cell, and
the lock-in amplifier performs lock-in detection of a phase between the output signal from the photodetector and a signal transmitted from the voltage controlled oscillator to the RF coils.

17. The magnetic field measurement system as recited in claim 16, wherein
intensity of the static magnetic field applied to the vapor cell is in a range of about 57.14 nT to 285.71 µT when using cesium ($^{133}$Cs) as the alkali metal in the vapor cell, in a range of about 42.85 nT to 214.27 µT when using rubidium ($^{85}$Rb), in a range of about 28.57 nT to 142.85 µT when using rubidium ($^{87}$Rb), in a range of about 28.57 nT to 142.85 µT when using potassium ($^{39}$K), and in a range of about 28.57 nT to 142.85 µT when using potassium ($^{41}$K).

18. The magnetic field measurement system as recited in claim 13, further comprising:
a microwave synthesizer; and
an electro-optic modulator disposed between the light source and the vapor cell, a voltage being applied to the electro-optic modulator from the microwave synthesizer, wherein
the lock-in amplifier performs lock-in detection of a phase between an output signal of the microwave synthesizer and the output signal of the photodetector, and
an amplitude of a voltage inputted from the microwave synthesizer to the electro-optic modulator is modulated based on a detection signal.

19. The magnetic field measurement system as recited in claim 13, wherein
the light source is a vertical cavity surface emitting semiconductor laser,
the system comprises a current modulator configured to apply a modulated current to the vertical cavity surface emitting semiconductor laser,
the lock-in amplifier performs lock-in detection of a phase between an output signal of the current modulator and the output signal of the photodetector, and
an amplitude and a frequency of the current applied from the current modulator to the vertical cavity surface emitting semiconductor laser are modulated based on a detection signal.

20. The magnetic field measurement system as recited in claim 16, wherein
the optical pumping magnetometer further includes:
a magnetic shield case configured to house the vapor cell, the static magnetic field applying coils and the RF coils, and
the magnetic shield case includes holes in an optical axis direction of the beam from the light source and in a direction of application of the static magnetic field.

21. The magnetic field measurement system as recited in claim 20, wherein
the static magnetic field applying coils include:
a first pair of static magnetic field applying coils provided in the optical axis direction of the beam from the light source while interposing the vapor cell; and a second pair of static magnetic field applying coils provided in a direction orthogonal to the optical axis direction while interposing the vapor cell, and a vectorial sum of static magnetic fields generated by the first and second pairs of static magnetic field applying coils is applied to the vapor cell.

22. The magnetic field measurement system as recited in claim 20, wherein the optical pumping magnetometer further includes:

a magnetometer disposed adjacently to the hole provided in the magnetic shield case in the optical axis direction of the beam from the light source; and magnetic field generating coils, one of the magnetic field generating coils being disposed between the magnetometer and the hole, and a magnetic field in an opposite phase to the environmental magnetic noise detected with the magnetometer is generated by the magnetic field generating coils.

23. The magnetic field measurement system as recited in claim 18, wherein the optical pumping magnetometer further includes a magnetic shield case configured to house the vapor cell and the static magnetic field applying coils, a direction of a magnetic field coming out of a measurement object is parallel to an optical axis from the light source, and the magnetic shield case includes holes in the optical axis direction.

24. The magnetic field measurement system as recited in claim 18, wherein the electro-optic modulator is housed in an electromagnetic shield case which includes holes in an optical axis direction of the beam from the light source.

25. The magnetic field measurement system as recited in claim 16, further comprising:

a first pair of the magnetic field generating coils and a second pair of magnetic field generating coils disposed to interpose the vapor cell, and to respectively generate magnetic fields in a first direction and in a second direction, which are orthogonal to a direction of the static magnetic field applied to the vapor cell, and which are orthogonal to each other;

the RF coils respectively provided between the vapor cell and the first pair of magnetic field generating coils; and a first magnetometer and a second magnetometer configured to detect environmental magnetic noise entering the vapor cell in the first direction and in the second direction, wherein a magnetic field in an opposite phase to the environmental magnetic noise detected with the first magnetometer is generated by the first pair of magnetic field generating coils, and a magnetic field in an opposite phase to the environmental magnetic noise detected with the second magnetometer is generated by the second pair of magnetic field generating coils.

26. The magnetic field measurement system as recited in claim 16, wherein the static magnetic field applying coils includes a first pair of static magnetic field applying coils and a second pair of static magnetic field applying coils, both of the pairs being disposed to interpose the vapor cell, the magnetic field measurement system further comprise:

first, second, and third magnetometers respectively disposed adjacently to the first pair of static magnetic field applying coils, the second pair of static magnetic field applying coils, and the RF coils; and first, second, and third pairs of magnetic field generating coils, the first pair of magnetic field generating coils being disposed between the first pair of static magnetic field applying coils and the first magnetometer, the second pair of magnetic field generating coils being disposed between the second pair of static magnetic field applying coils and the second magnetometer, and the third pair of magnetic field generating coils being disposed between the RF coils and the third magnetometer, a magnetic field in an opposite phase to environmental magnetic noise detected with the first magnetometer is generated by the first pair of magnetic generating coils, a magnetic field in an opposite phase to environmental magnetic noise detected with the second magnetometer is generated by the second pair of magnetic generating coils, and a magnetic field in a phase opposite to environmental magnetic noise detected with the third magnetometer is generated by the third pair of magnetic generating coils.

27. The magnetic field measurement system as recited in claim 18, further comprising:

a first pair of the magnetic field generating coils and a second pair of magnetic field generating coils disposed to interpose the vapor cell and to respectively generate magnetic fields in a first direction and in a second direction, which are orthogonal to a direction of the static magnetic field applied to the vapor cell, and which are orthogonal to each other;

a first magnetometer configured to detect environmental magnetic noise entering the vapor cell in the first direction; and a second magnetometer configured to detect environmental magnetic noise entering the vapor cell in the second direction, wherein a magnetic field in an opposite to the environmental magnetic noise detected with the first magnetometer is generated by the first pair of magnetic generating coils, and a magnetic field in an opposite to the environmental magnetic noise detected with the second magnetometer is generated by the second pair of magnetic generating coils.

28. The magnetic field measurement system as recited in claim 27, wherein the electro-optic modulator is housed in an electromagnetic shield case which includes holes in an optical axis direction of the beam from the light source.

29. An optical pumping magnetometer comprising:

a light source;

a vapor cell filled with an alkali metal gas;

an optical system configured to convert beam from the light source into circularly polarized beam, and to make the circularly polarized beam incident on the vapor cell;

a photodetector configured to detect the beam passing through the vapor cell;

static magnetic field applying coils configured to apply a static magnetic field to the vapor cell;

a voltage controlled oscillator;

radio-frequency (RF) coils driven by the voltage controlled oscillator and configured to apply an oscillating magnetic field in a direction orthogonal to the static magnetic field to the vapor cell;

a magnetic shield case being configured to house the vapor cell, the static magnetic field applying coils and the RF coils therein, and including holes provided in an optical axis direction of the beam from the light source and in a direction of application of the static magnetic field; and a lock-in amplifier configured to detect a magnetic field by performing lock-in detection of a phase between an output signal from the photodetector and a signal transmitted from the voltage controlled oscillator to the RF coils.

30. The optical pumping magnetometer as recited in claim 29, wherein
the static magnetic field applying coils include:
a first pair of static magnetic field applying coils provided in the optical axis direction of the beam from the light source while interposing the vapor cell; and
a second pair of static magnetic field applying coils provided in a direction orthogonal to the optical axis direction while interposing the vapor cell.

31. The optical pumping magnetometer as recited in claim 29, further comprising:
a magnetometer disposed adjacently to one of the holes provided in the magnetic shield case in the optical axis direction of the beam from the light source; and
a pair of magnetic field generating coils, one of the coils being disposed between the magnetometer and one of the holes, wherein
a magnetic field in a phase opposite to environmental magnetic noise detected with the magnetometer is generated by the pair of magnetic generating coils.

32. An optical pumping magnetometer comprising:
a light source;
a vapor cell filled with an alkali metal gas;
static magnetic field applying coils configured to apply a static magnetic field to the vapor cell;
a magnetic shield case configured to house the vapor cell and the static magnetic field applying coils:
an optical system configured to convert beam from the light source into circularly polarized beam, and to make the circularly polarized beam incident on the vapor cell;
a photodetector configured to detect the beam passing through the vapor cell;
a microwave synthesizer;
an electro-optic modulator connected to the microwave synthesizer, disposed in the middle of an optical path from the light source, and configured to modulate a phase of the beam from the light source; and
a lock-in amplifier configured to perform lock-in detection of a phase between an output signal from the microwave synthesizer and an output signal from the photodetector, and to modulate an amplitude of a voltage inputted from the microwave synthesizer to the electro-optic modulator based on a detection signal.

33. An optical pumping magnetometer comprising:
a vertical cavity surface emitting semiconductor laser light source;
a vapor cell filled with an alkali metal gas;
static magnetic field applying coils configured to apply a static magnetic field to the vapor cell;
a magnetic shield case configured to house the vapor cell and the static magnetic field applying coils:
an optical system configured to convert beam from the light source into circularly polarized beam and to make the circularly polarized beam incident on the vapor cell;
a photodetector configured to detect the beam passing through the vapor cell;
a current modulator configured to modulate a phase of outputted beam by applying current to the vertical cavity surface emitting semiconductor laser light source; and
a lock-in amplifier configured to perform lock-in detection of a phase between an output signal from the current modulator and an output signal from the photodetector, and to modulate an amplitude and a frequency of the current applied from the current modulator to the vertical cavity surface emitting semiconductor laser light source based on a detection signal.

34. The optical pumping magnetometer as recited in claim 32, wherein
the electro-optic modulator is housed in an electromagnetic shield case which includes holes in an optical axis direction of the beam from the light source.

35. An optical pumping magnetometer comprising:
a light source;
a vapor cell filled with an alkali metal gas;
static magnetic field applying coils configured to apply a static magnetic field to the vapor cell;
a voltage controlled oscillator;
radio-frequency (RF) coils driven by the voltage controlled oscillator, and configured to apply an oscillating magnetic field in a first direction orthogonal to the static magnetic field to the vapor cell;
a first pair of magnetic field generating coils disposed to interpose the vapor cell, and configured to generate a magnetic field in the first direction;
a second pair of magnetic field generating coils disposed to interpose the vapor cell, and configured to generate a magnetic field in a direction of the static magnetic field applied by the static magnetic field applying coils and in a second direction orthogonal to the first direction;
a first magnetometer configured to detect environmental magnetic noise entering the vapor cell in the first direction;
a second magnetometer configured to detect environmental magnetic noise entering the vapor cell in the second direction;
an optical system configured to convert beam from the light source into circularly polarized beam, and to make the circularly polarized beam incident on the vapor cell;
a photodetector configured to detect the beam passing through the vapor cell; and
a lock-in amplifier configured to perform lock-in detection of a phase between an output signal from the photodetector and a signal transmitted from the voltage controlled oscillator to the RF coils, wherein
a magnetic field in an opposite to the environmental magnetic noise detected with the first magnetometer is generated by the first pair of magnetic field generating coils, and
a magnetic field in an opposite to the environmental magnetic noise detected with the second magnetometer is generated by the second pair of magnetic field generating coils.

36. An optical pumping magnetometer comprising:
a light source;
a vapor cell filled with an alkali metal gas;
means for applying a static magnetic field to the vapor cell, the means including a first pair of static magnetic field applying coils disposed to interpose the vapor cell and configured to generate a static magnetic field in the first direction, and a second pair of magnetic field applying coils disposed to interpose the vapor cell and configured to generate a static magnetic field in a second direction orthogonal to the first direction;
a voltage controlled oscillator;
radio-frequency (RF) coils driven by the voltage controlled oscillator, and configured to apply an oscillating magnetic field to the vapor cell in a third direction orthogonal to the first and second directions;

a first pair of magnetic field generating coils disposed to interpose the vapor cell, and configured to generate a magnetic field in the first direction;
a second pair of magnetic field generating coils disposed to interpose the vapor cell, and configured to generate a magnetic field in the second direction:
a third pair of magnetic field generating coils disposed to interpose the vapor cell, and configured to generate a magnetic field in the third direction;
a first magnetometer configured to detect environmental magnetic noise entering the vapor cell in the first direction;
a second magnetometer configured to detect environmental magnetic noise entering the vapor cell in the second direction;
a third magnetometer configured to detect environmental magnetic noise entering the vapor cell in the third direction;
an optical system configured to convert beam from the light source into circularly polarized beam, and to make the circularly polarized beam incident on the vapor cell;
a photodetector configured to detect the beam passing through the vapor cell; and
a lock-in amplifier configured to perform lock-in detection of a phase between an output signal from the photodetector and a signal transmitted from the voltage controlled oscillator to the RF coils, wherein
a magnetic field in an opposite to the environmental magnetic noise detected with the first magnetometer is generated by the first pair of magnetic field generating coils,
a magnetic field in an opposite to the environmental magnetic noise detected with the second magnetometer is generated by the second pair of magnetic field generating coils, and
a magnetic field in an opposite to the environmental magnetic noise detected with the third magnetometer is generated by the third pair of magnetic field generating coils.

37. An optical pumping magnetometer comprising:
a light source;
a vapor cell filled with an alkali metal gas;
an optical system configured to convert beam from the light source into circularly polarized beam, and to make the circularly polarized beam incident on the vapor cell;
a photodetector configured to detect the beam passing through the vapor cell;
static magnetic field applying coils configured to apply a static magnetic field to the vapor cell;
a first pair of magnetic field generating coils and a second pair of magnetic field generating coils disposed to interpose the vapor cell and configured to respectively generate magnetic fields in a first direction and in a second direction, which are orthogonal to a direction of the static magnetic field applied to the vapor cell, and which are orthogonal to each other;
a first magnetometer configured to detect environmental magnetic noise entering the vapor cell in the first direction;
a second magnetometer configured to detect environmental magnetic noise entering the vapor cell in the second direction;
an electro-optic modulator to which a voltage is applied by a microwave synthesizer, and which is configured to modulate a phase of the beam from the light source; and
a lock-in amplifier configured to perform lock-in detection of a phase between an output signal from the microwave synthesizer and an output signal from the photodetector, and to modulate an amplitude of a voltage inputted from the microwave synthesizer to the electro-optic modulator based on a detection signal, wherein
a magnetic field in an opposite to the environmental magnetic noise detected with the first magnetometer is generated by the first pair of magnetic field generating coils, and
a magnetic field in an opposite to the environmental magnetic noise detected with the second magnetometer is generated by the second pair of magnetic field generating coils.

38. An optical pumping magnetometer comprising:
a vertical cavity surface emitting semiconductor laser as a light source;
a vapor cell filled with an alkali metal gas;
static magnetic field applying coils configured to apply a static magnetic field to the vapor cell;
a first pair of magnetic field generating coils and a second pair of magnetic field generating coils disposed to interpose the vapor cell and configured to respectively generate magnetic fields in a first direction and in a second direction, which are orthogonal to a direction of the static magnetic field applied to the vapor cell, and which are orthogonal to each other;
a first magnetometer configured to detect environmental magnetic noise entering the vapor cell in the first direction;
a second magnetometer configured to detect environmental magnetic noise entering the vapor cell in the second direction;
an optical system configured to convert beam from the light source into circularly polarized beam, and to make the circularly polarized beam incident on the vapor cell;
a photodetector configured to detect the beam passing through the vapor cell;
a current modulator configured to modulate a phase of beam outputted from the vertical cavity surface emitting semiconductor laser by applying a current to the vertical cavity surface emitting semiconductor laser; and
a lock-in amplifier configured to perform lock-in detection of a phase between an output signal from the current modulator and an output signal from the photodetector, and to modulate an amplitude and a frequency of the current applied from the current modulator to the vertical cavity surface emitting semiconductor laser based on a detection signal, wherein
a magnetic field in an opposite to the environmental magnetic noise detected with the first magnetometer is generated by the first pair of magnetic field generating coils, and
a magnetic field in an opposite to the environmental magnetic noise detected with the second magnetometer is generated by the second pair of magnetic field generating coils.

39. The optical pumping magnetometer as recited in claim 37, wherein
the electro-optic modulator is housed in an electromagnetic shield case which includes holes in an optical axis direction of the beam from the light source.

40. A multichannel optical pumping magnetometer comprising:
light sources;
a plurality of vapor cells being arranged in a lattice and being filled with an alkali metal gas;
pairs of static magnetic field applying coils configured to apply static magnetic fields to the respective vapor cells;

optical systems configured to convert beam from the light sources into circularly polarized beam and to make the circularly polarized beam incident on the plurality of vapor cells;

photodetectors configured to detect the beam passing through the respective vapor cells;

voltage controlled oscillators;

pairs of radio-frequency (RF) coils driven by the voltage controlled oscillators, and configured to apply oscillating magnetic fields in a direction orthogonal to the static magnetic field to the respective vapor cells;

lock-in amplifiers configured to perform lock-in detection of phases between output signals from the photodetectors and signals transmitted from the voltage controlled oscillators to the respective pairs of RF coils; and current controllers configured to control currents respectively applied to the pairs of static magnetic field applying coils of the plurality of vapor cells, wherein static magnetic field intensities respectively applied to the plurality of vapor cells are adjusted to be different from one another by use of the current control device.

41. The multichannel optical pumping magnetometer as recited in claim 40, further comprising:

magnetic shield cases in the same number as the number of the vapor cells, each of the magnetic shield cases including holes in an optical axis direction of the beam from the light sources and in a direction of application of the static magnetic fields, wherein the vapor cells, and the pairs of static magnetic field applying coils and the pairs of RF coils both of which accompany the respective vapor cells are housed in each of the magnetic shield cases.

42. The multichannel optical pumping magnetometer as recited in claim 41, wherein the pairs of static magnetic field applying coils in each of the magnetic shield cases includes:

a first pair of static magnetic field applying coils disposed in the optical axis direction of the beam from the light sources while interposing the vapor cell; and a second pair of static magnetic field applying coils disposed in a direction orthogonal to the optical axis direction of the beam from the light sources while interposing the vapor cell.

43. The multichannel optical pumping magnetometer as recited in claim 41, further comprising, in terms of each of the magnetic shield cases:

a magnetometer disposed adjacently to one of holes in the magnetic shield case in the direction of the optical axis of the beam from the light source, and being configured to detect environmental magnetic noise entering the vapor cell; and a pair of magnetic field generating coils, one of the coils being disposed between the magnetometer and one of the holes, wherein a magnetic field in an opposite to the environmental magnetic noise detected with the magnetometer is generated by the pair of magnetic field generating coils.

44. A multichannel optical pumping magnetometer comprising:

light sources;

a plurality of vapor cells being arranged in a lattice, and being filled with an alkali metal gas;

pairs of static magnetic field applying coils configured to apply static magnetic fields to the respective vapor cells;

optical systems configured to convert beam from the light sources into circularly polarized beam and to make the circularly polarized beam incident on the plurality of vapor cells in parallel to a direction of application of the static magnetic fields;

photodetectors configured to detect the beam passing through the respective vapor cells;

microwave synthesizers;

electro-optic modulators respectively connected to the microwave synthesizers, disposed in the middle of optical paths from the light sources, and configured to modulate a phase of the beam from the light sources;

lock-in amplifiers configured to perform lock-in detection of phases between output signals from the microwave synthesizers and output signals from the photodetectors, and to modulate an amplitude of voltages inputted from the microwave synthesizers to the electro-optic modulators based on detection signals;

magnetic shield cases in the same number as the number of the vapor cells, each of the magnetic shield cases including holes in an optical axis direction of the beam from the light sources, wherein the vapor cells and the accompanying pair of static magnetic field applying coils are housed in the respective magnetic shield cases.

45. A multichannel optical pumping magnetometer comprising:

vertical cavity surface emitting semiconductor lasers as light sources;

a plurality of vapor cells being arranged in a lattice, and being filled with an alkali metal gas;

optical systems configured to convert beam from the light sources into circularly polarized beam, and to make the circularly polarized beam incident on the plurality of vapor cells in parallel to a direction of application of a static magnetic fields;

photodetectors configured to detect the beam passing through the respective vapor cells;

pairs of static magnetic field applying coils configured to apply the static magnetic fields to the respective vapor cells;

current modulators configured to modulate a phase of light outputted from the vertical cavity surface emitting semiconductor lasers by applying currents respectively to the vertical cavity surface emitting semiconductor lasers;

lock-in amplifiers configured to perform lock-in detection of phases between output signals from the current modulators and output signals from the photodetectors, and to modulate amplitudes and frequencies of the current applied from the current modulators to the respective vertical cavity surface emitting semiconductor lasers based on detection signals; and magnetic shield cases in the same number as the number of the vapor cells, each of the magnetic shield cases including a hole formed in an optical axis direction of the beam from the light sources, wherein the vapor cells and the accompanying pair of static magnetic field applying coils are housed in the respective magnetic shield cases.

46. The multichannel optical pumping magnetometer as recited in claim 40, wherein intensity of the static magnetic field applied to the vapor cell is set greater than about 57.14 nT when using cesium ($^{133}$Cs) as the alkali metal in the vapor cell, greater than about 42.85 nT when using rubidium ($^{85}$Rb), greater than about 28.57 nT when using rubidium ($^{87}$Rb), greater than about 28.57 nT when using potassium ($^{39}$K), and greater than about 28.57 nT when using potassium ($^{41}$K).

47. The multichannel optical pumping magnetometer as recited in claim 40, wherein frequencies of the oscillating magnetic fields applied from the plurality of pairs of RF coils to the vapor cells are adjusted in order that, in a resonance curve graph in which output voltages from the photodetectors are expressed with an axis of ordinates and in which frequencies of the oscillating magnetic fields from the RF coils are expressed with an axis of abscissae, output voltages at intersections of mutually adjacent resonance curves can be smaller than a half value of a peak of an adjacent resonance curve whose peak is smaller.

48. The optical pumping magnetometer as recited in claim 29, wherein the RF coils apply a rotational magnetic field having a magnetic field intensity half as large as the oscillating magnetic field instead of applying the oscillating magnetic field.

49. The optical pumping magnetometer as recited in claim 29, wherein any one of a rare gas and a nonmagnetic gas is filled as a buffer gas in the vapor cell.

50. The optical pumping magnetometer as recited in claim 29, wherein the vapor cell is coated with a nonmagnetic material on an inner wall.

* * * * *